US007263431B2

(12) United States Patent
Hashimoto et al.

(10) Patent No.: US 7,263,431 B2
(45) Date of Patent: Aug. 28, 2007

(54) ANALOG INPUT SIGNAL PROCESSING CIRCUIT

(75) Inventors: Koji Hashimoto, Tokyo (JP); Tetsushi Watanabe, Tokyo (JP); Manabu Yamashita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/353,052

(22) Filed: Feb. 14, 2006

(65) Prior Publication Data

US 2007/0067090 A1     Mar. 22, 2007

(30) Foreign Application Priority Data

Sep. 20, 2005    (JP)    ............................. 2005-271853

(51) Int. Cl.
*G06F 19/00*    (2006.01)
(52) U.S. Cl. .................................................... 701/111
(58) Field of Classification Search ................ 701/111, 701/102, 115
See application file for complete search history.

(56) References Cited

U.S. PATENT DOCUMENTS 4,257,034 A * 3/1981 Wilkinson .................. 701/115
4,553,518 A * 11/1985 Takao et al. ................ 123/478
4,580,221 A * 4/1986 Isobe et al. ................. 701/105
7,010,419 B2 * 3/2006 Abe et al. ................... 701/111

FOREIGN PATENT DOCUMENTS

| JP | 05-306645 A | 11/1993 |
| JP | 11-205113 A | 7/1999 |
| JP | 2002-016460 A | 1/2002 |
| JP | 2002-130043 A | 5/2002 |

* cited by examiner

*Primary Examiner*—Hieu T. Vo
(74) *Attorney, Agent, or Firm*—Sughrue Mion, PLLC

(57) ABSTRACT

A signal voltage, which a variable analog signal source generates, is inputted to a microprocessor via a gain adjustment circuit, a switched capacitor filter circuit, and an analog comparison circuit. The microprocessor that cooperates with a program memory generates a control signal pulse train of a variable period and a variable duty. Filter characteristics are adjusted with a period of the control signal pulse trains CNTa and CNTb, and gain is adjusted with a pulse duty. Even if a comparison reference voltage of the analog adjustment circuit is a fixed value, it is possible to make virtual change and adjustment of a comparison reference voltage by adjusting a gain of the gain adjustment circuit. As a result, it is possible to provide an analog input signal processing circuit capable of individually adjusting input filter characteristics and input gain.

13 Claims, 15 Drawing Sheets

ANALOG INPUT SIGNAL PROCESSING CIRCUIT

BACKGROUND OF THE INVENTION

1. Field of the Invention

The present invention relates to an analog input signal processing circuit for inputting to a microprocessor signals related to signal voltages of a variable analog signal source and, more particularly, to an improved analog input signal processing circuit for making the variable control of gain of an input circuit and frequency characteristics with high accuracy.

2. Description of the Related Art

An analog input signal processing circuit having both functions to adjust gain and to adjust frequency characteristics is well known.

For example, according to the Japanese Patent Publication (unexamined) No, 16460/2002 "Gain Control Circuit", proposed is a concept in which the adjustment of gain is made by changing a switching duty ratio of switching elements that are connected in parallel or in series with a resistor to determine a gain of an operational amplifier; and the control of frequency characteristics of a filter is made in an AC amplifier.

Further, a switched capacitor filter has been widely used as a component of a filter circuit.

For example, according to the Japanese Patent Publication (unexamined) No. 205113/1999 "Switching Circuit and Switched Capacitor Filter", proposed is a concept in which an equivalent variable resistance, of which resistance value R is expressed with R=Ts/C1, is obtained by charging and discharging a capacitor of a capacity C1 in a variable period Ts.

According to the Japanese Patent Publication (unexamined) No. 130043/2002 "Signal Processing Unit", proposed is a concept of a knock determination device of an engine using a switched capacitor filter circuit acting as a band pass filter, a variable gain amplifier circuit, and a peak hold circuit.

Further, according to the Japanese Patent Publication (unexamined) No. 306645/1993 "Internal Combustion Engine Knocking detection Device", proposed is a concept of adjusting signal pass frequency bands of a switched capacitor filter forming a bandpass filter (hereinafter simply referred to as "band filter") depending on operation state of an internal combustion engine.

In the gain control circuit according to the above-mentioned Japanese Patent Publication (unexamined) No, 16460/2002, no concept of changing a switching frequency of switching elements is included, and gain and frequency characteristics of a filter are changed in cooperation by changing a switching duty ratio of switching elements, thus being incapable of changing and adjusting individually the maximum gain and frequency characteristics.

Moreover, in the signal processing circuit according to the above-mentioned Japanese Patent Publication No. 130043/2002 or the above-mentioned Japanese Patent Publication No. 306645/1993, signals of adjusting filter characteristics and signals of adjusting gain characteristics are separated respectively, so that it is necessary for a control section to provide two kinds of control signals.

SUMMARY OF THE INVENTION

The present invention was made to solve the problems as described above, and has an object of providing an analog input signal processing circuit capable of individually adjusting the maximum gain and filter characteristics of an input circuit with one control signal at low cost and with high accuracy.

To accomplish the foregoing object, the invention provides an analog input signal processing circuit for inputting to a microprocessor a signal related to a signal voltage of a variable analog signal source. This analog input signal processing circuit is provided with at least a switched capacitor filter circuit, a gain adjustment circuit, and a data conversion circuit; and a non-volatile program memory that cooperates with the mentioned microprocessor includes a program acting as control pulse train generation means.

The mentioned microprocessor is arranged so as to provide a common control signal pulse train to the mentioned switched capacitor filter circuit and gain adjustment circuit with the mentioned control pulse train generation means.

The mentioned switched capacitor filter circuit is a circuit which includes a switching element of which switching is controlled with a control signal pulse train commanded from the mentioned microprocessor, and a charge/discharge capacitor; and of which filter characteristics are variable-controlled in response to a pulse frequency of the mentioned control signal pulse train.

The mentioned gain adjustment circuit is a circuit that is commanded from the mentioned microprocessor, that makes the switching control of an amplification factor adjustment switching element of which switching is controlled with a control signal pulse train, and that makes the variable control of an amplification factor with respect to an input signal voltage in response to a pulse duty, being ON time period/period or OFF time period/period of a control signal pulse train.

The mentioned data conversion circuit is means that converts a detection current value responsive to a signal voltage of a variable analog signal source, which is obtained via the mentioned switched capacitor filter circuit and gain adjustment circuit, to a digital logic signal to input it to the mentioned microprocessor, and writes it in a RAM memory acting as a detection data memory via this microprocessor.

The mentioned control pulse train generation means is formed of: a first setting means for changing and setting a pulse period; a second setting means for changing and setting a pulse duty; pulse width operation setting means for calculating and setting a product of a pulse period and a pulse duty having been changed and set by the first setting means and the second setting means; interrupt counting means for counting the number of times of fixed-time interrupts; flag output generation means in which flag is set when a counter current value of this interrupt counting means has reached a set value calculated by the mentioned pulse width operation setting means; and reset means for resetting the mentioned counter current value and a flag output when a counter current value of the mentioned interrupt counting means has reached a pulse period that is variable-set by the mentioned first setting means; and in which a flag output from the mentioned flag output generation means is the control signal pulse train.

According to the analog input signal processing circuit of the invention, frequency characteristics of an input filter that is located in a signal input circuit can be adjusted without restraint by means of a microprocessor; and the entire gain of an input circuit can be adjusted using the same control signal. Thus, it is possible to reduce the number of signals output from the microprocessor.

Further, even if a period of a control signal pulse train is changed and filter characteristics are changed, in case of no change in duty, a gain of the input circuit is not changed. On the contrary, even if a duty of a control signal pulse train is changed and a gain of the input circuit is changed, in case of no change in period, filter characteristics are not changed. Thus, it becomes possible to make the mutually independent adjustment.

Furthermore, it is arranged such that a flag output to be outputted from the flag output generation means forming control pulse train generation means is a control signal pulse train, so that a control signal pulse train is a high-speed pulse train based on the interrupt operation.

Accordingly, as a result of using a control signal pulse train of high-speed operation, it is possible to cause a capacitor used in a switched capacitor filter or a gain adjustment circuit to be of small capacity, small size, and low price.

Furthermore, the change of filter characteristics and the change of gain characteristics may be done by just one interrupt counting means, so that it is possible to reduce the load of a microprocessor.

The foregoing and other objects, features, aspects and advantages of the present invention will become more apparent from the following detailed description of the present invention when taken in conjunction with the accompanying drawings.

DETAILED DESCRIPTION OF THE INVENTION

Figure 1:
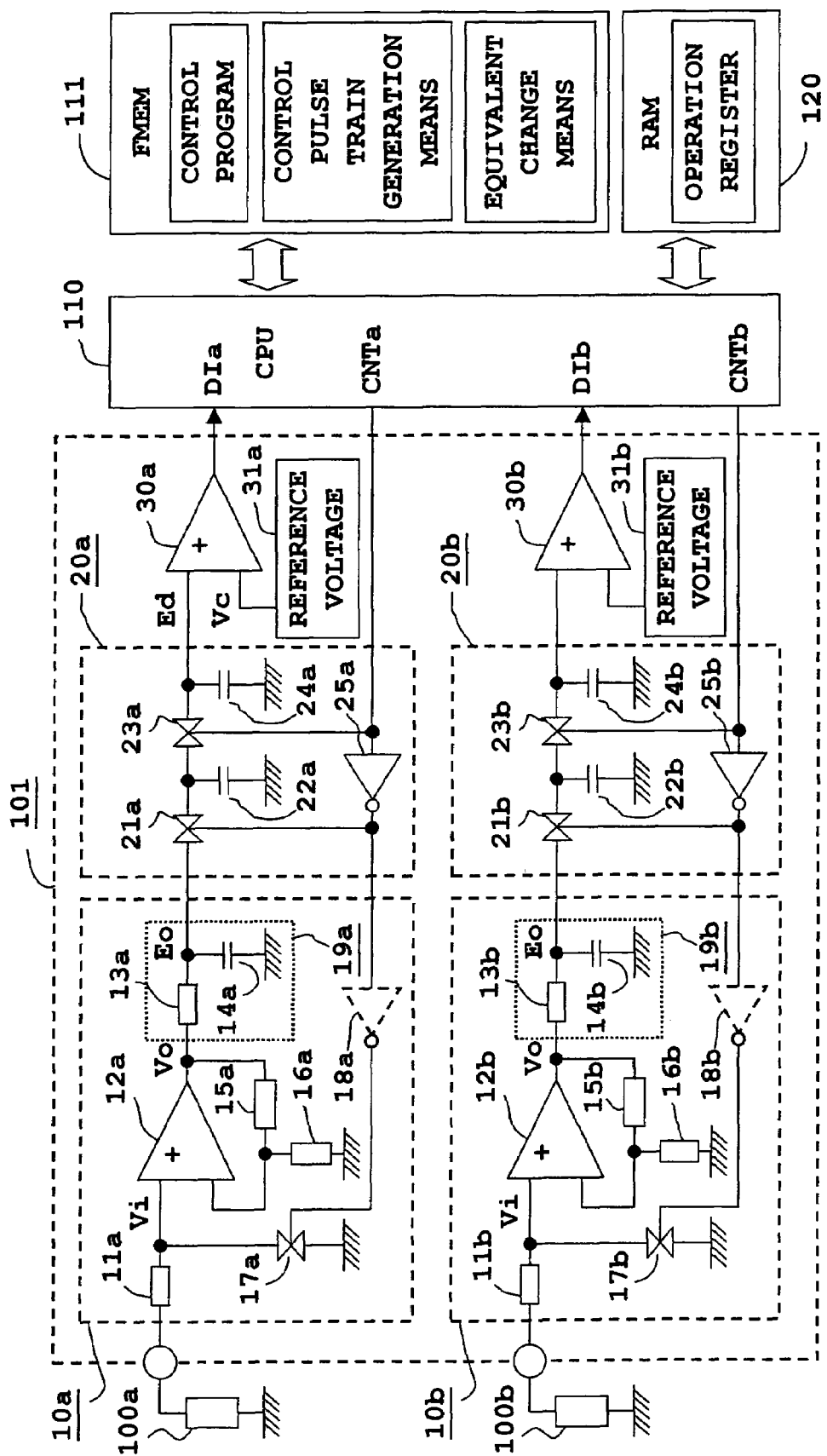
FIG. 1 is a diagram showing the entire circuit arrangement of an analog input signal processing circuit according to a first preferred embodiment of the present invention.

Several preferred embodiments according to the present invention are hereinafter described referring to the drawings.

In addition, the same reference numerals indicate the same or like parts throughout the drawings.

EMBODIMENT 1

FIG. 1 is a diagram showing the entire circuit arrangement of an analog input signal processing circuit according to a first embodiment of the invention.

As shown in FIG. 1, an analog input signal processing circuit 101 according to the first embodiment is provided between variable analog signal sources 100a, 100b and a microprocessor 110.

The analog input signal processing circuit 101 according to the first embodiment is formed of: gain adjustment circuits 10a and 10b, switched capacitor filter circuits 20a and 20b forming low-pass filter circuits, and analog comparison circuits 30a and 30b acting as data conversion circuits. Comparison results between analog signal sources 100a and 100b and comparison reference voltages 31a and 31b are inputted to the microprocessor 110 as digital logic signals DIa and DIb.

A gain adjustment circuit 10a is formed of: an amplifier 12a having a non-inverting side input to which an output voltage from the variable analog signal source 10a is connected as an input voltage Vi via an input resistor 11a; a series circuit of a smoothing resistor 13a and a smoothing capacitor 14a that are connected to an output terminal of the amplifier 12a; voltage-dividing resistors 15a and 16a connected to an output terminal of the amplifier 12a; an amplification factor adjustment switching element 17a to ground an input signal terminal; and an inverter 18a to provide switching signals to this switching element 17a. A connection point of the voltage-dividing resistors 15a and 16a is connected to a non-inverting side input of the amplifier 12a; and the smoothing resistor 13a and the smoothing capacitor 14a forms a smoothing filter circuit 19a.

A voltage across the smoothing capacitor 14a is applied to an input of the switched capacitor filter circuit 20a as an output voltage E0 from the gain adjustment circuit 10a. When a switching element 21a is brought in conduction, the charge and discharge is made between a charge/discharge capacitor 22a and the smoothing capacitor 14a, resulting in the same voltage E0.

At this time, an electric charge Q1 that is charged in the charge/discharge capacitor 22a is Q1=E0×C22a: where C22a is an electrostatic capacity of the charge/discharge capacitor 22a.

When a switching element 23a that makes the inversion operation is brought in conduction instead of the switching element 21a, the charge and discharge is made between the charge/discharge capacitor 22a and an integrating capacitor 24a, resulting in the same voltage Ed. At this time, an electric charge Q2 that remains and is charged in the charge/discharge capacitor 22a is Q2=Ed×C22a.

The movement of an electric charge during a period of a switching cycle Ta of the switching elements 21a and 23a is ΔQ=Q1−Q2=(E0−Ed)×C22a. An average current flowing from the smoothing capacitor 14a to an integrating capacitor 24a is I=ΔQ/Ta=(E0−Ed)×C22a/Ta.

Accordingly, an equivalent resistance Ra of a switched capacitor circuit with the switching elements 21a and 23a and the charge/discharge capacitor 22a is expressed with the following equation (1), and acts as a variable resistance that is changed based on values of a switching period Ta.

$$Ra=(E0-Ed)/I=Ta/C22a \qquad (1)$$

An output voltage Ed of the integrating capacitor 24a is applied to a non-inverting input of the analog comparison circuit 30a acting as a data conversion circuit, and a comparison reference voltage 31a of a predetermined voltage Vc is applied to an inverting input.

The switching element 23a makes the switching operation in response to a control signal pulse train CNTa that the microprocessor 110 generates; while the switching element 21a makes the switching operation in response to a control signal pulse train CNTa via an inverter 25a. An output from the inverter 25a is provided to an input of the inverter 18a.

In addition, although the switching element 21a is in non-conducting state when the switching element 17a is in conduction according to the first embodiment of FIG. 1, it is preferable that the inverter 18a is eliminated, and the switching element 17a and the switching element 21a are simultaneously brought in conduction.

A gain adjustment circuit 10b, a switched capacitor filter circuit 20b and an analog comparison circuit 30b are also arranged in the same manner as the above-described gain adjustment circuit 10a, the switched capacitor filter circuit 20a and the analog comparison circuit 30a, and are controlled with a control signal pulse train CNTb that the microprocessor 110 generates.

In a non-volatile program memory 111 such as flash memory, which is bus-connected to the microprocessor 110, stored are programs acting as the later-described pulse train generation means and equivalent change means, and control programs fit for the uses of the microprocessor 110.

In addition, equivalent changing means is means for obtaining the analog comparison circuits 30a and 30b with comparison reference voltages that are equivalently changed by changing pulse duties α and β of control signal pulse trains CNTa and CNTb to change an input/output ratio of the gain adjustment circuits 10a and 10b.

An RAM memory 120 that is bus-connected to the microprocessor 110 stores comparison results of the analog comparison circuits 30a and 30b, and is used as the later-described operation register.

Additionally, although a flash memory used in the program memory 111 is a large capacity of non-volatile memory capable of being electrically written and read to make the storage at power failure, it is a memory of which data needs to be electrically batch-erased at the time of writing.

Furthermore, although the RAM memory 120 is a memory capable of being electrically written and read at high speed without restraint in a unit of one byte, the loss of stored information occurs due to power failure.

Figure 2:
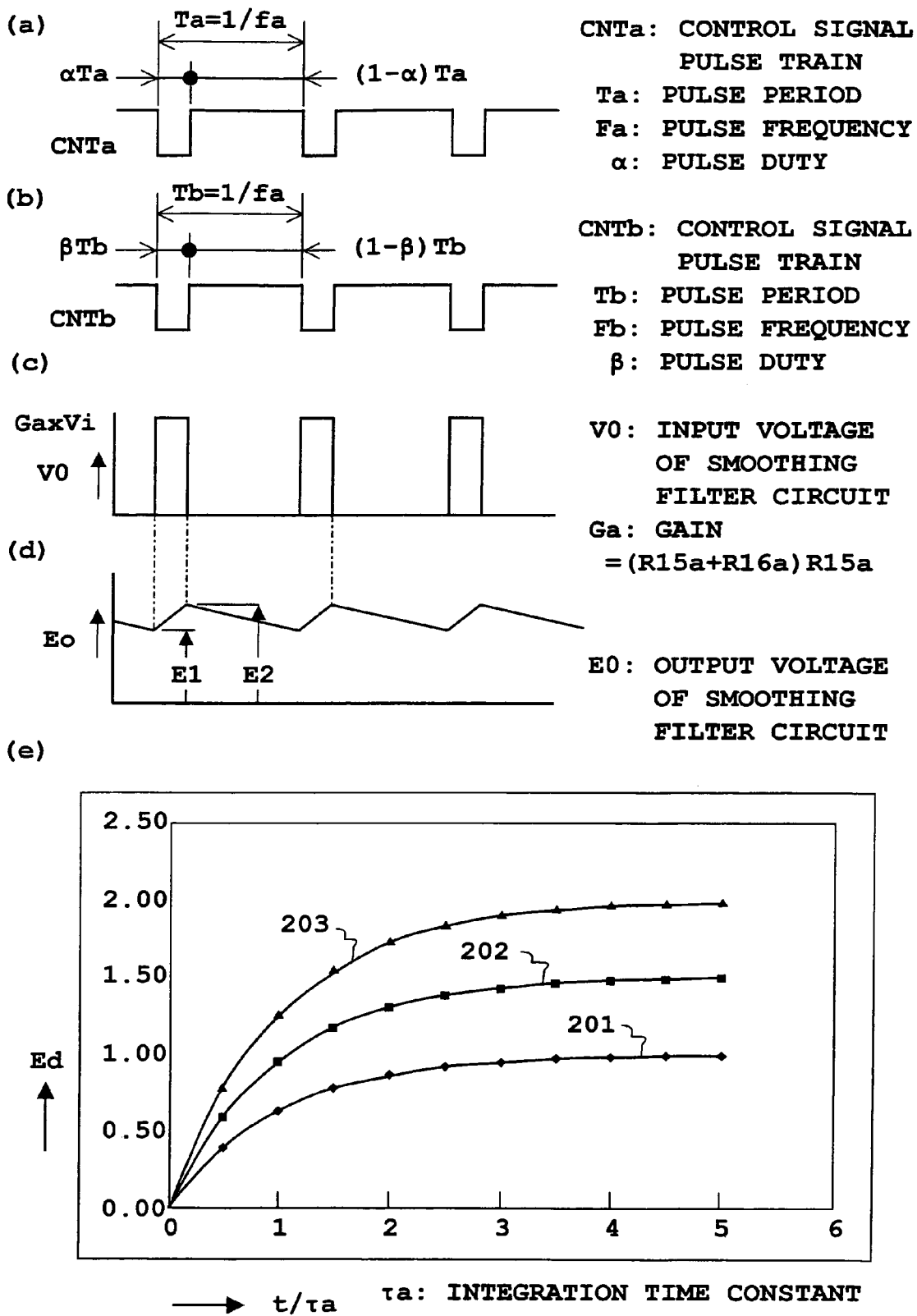
FIGS. 2(a), (b), (c), (d) and (e) are diagrams each for explaining operations of the analog input signal processing circuit according to the first embodiment.

FIGS. 2(a), (b), (c), (d) and (e) are diagrams each for explaining operations of the analog input signal processing circuit according to the first embodiment shown in FIG. 1.

FIG. 2(a) represents a waveform of a control signal pulse train CNTa. In this waveform, logic levels are alternately inverted in a period Ta, being an inverse number of a frequency fa, and a pulse duty is defined as a ratio between a period in which a logic level is "L" and a period Ta.

FIG. 2(b) represents a waveform of a control signal pulse train CNTb. In this waveform, logic levels are alternately inverted in a period Tb, being an inverse number of a frequency fb, and a pulse duty is defined as a ratio between a period in which a logic level is "L" and a period Tb.

FIG. 2(c) represents a waveform of an output voltage V0 from the amplifier 12a. When a logic level of a control signal pulse output CNTa is "L" and the switching element 17a is non-conducting state, it is a voltage of Ga×Vi. When a logic level of a control signal pulse output CNTa is "H" and the switching element 17a is in conduction, it is 0 voltage: where gain Ga=(a resistance value R15 of the voltage-dividing resistor 15a+a resistance value R16 of the voltage-dividing resistor 16a)/(a resistance value R16 of the voltage-dividing resistor 16a.

FIG. 2(d) represents a waveform of an output voltage E0 from the smoothing filter circuit 19a. When (an integration time constant τs of the smoothing filter circuit 19a)=(a resistance value R13 of the smoothing resistor 13a)×(an electrostatic capacity C14 of the smoothing capacitor 14a) and on condition that Ta<<τs=R13×C14, an output voltage E0 is calculated with the following equation.

$$E0 \approx E2 \approx E1 \approx Ga \times \alpha \times Vi \qquad (2)$$

: where Ga=(R15+R16)/R16

It is the same on the side of the gain adjustment circuit 10b.

Therefore, input/output ratios (=output voltage E0/input voltage Vi) of the gain adjustment circuits 10a and 10b are changed in proportion to pulse duties of control signal pulse trains CNTa and CNTb.

FIG. 2(e) represents a waveform of output voltages Ed of the switched capacitor filter 20a with respect to an elapsed time t from when an output voltage from the variable analog signal source 100a is made constant and is applied to the gain adjustment circuit 10a and onward at a predetermined pulse duty α. A curve 201 is an output voltage waveform when a pulse duty α is small. A curve 203 is an output voltage waveform when the pulse duty α is medium. A curve 203 is an output voltage waveform when the pulse duty α is large. A saturation output voltage when an elapsed time t is a sufficiently large value will be a value expressed with the equation (2).

In each output voltage waveform, an integration time constant 1a corresponding to an elapsed time, at which a value of 63% a saturation output voltage is reached, is expressed with the following equation (3) when letting an electrostatic capacity of an integrating capacitor C24a, and the axis of abscissas of FIG. 2(e) is expressed with (elapsed time t/integration time constant τa).

$$\tau a = Ra \times C24a = Ta \times C24a/C22a \qquad (3)$$

An integration time constant τb of the switched capacitor filter 20b is the same.

Thus, integration time constants τa and τb, being filter characteristics of the switched capacitor filters 20a and 20b forming low-pass filters, are changed in proportion to pulse periods Ta and Tb of control signal pulse trains CNTa and CNTb.

Figure 3:
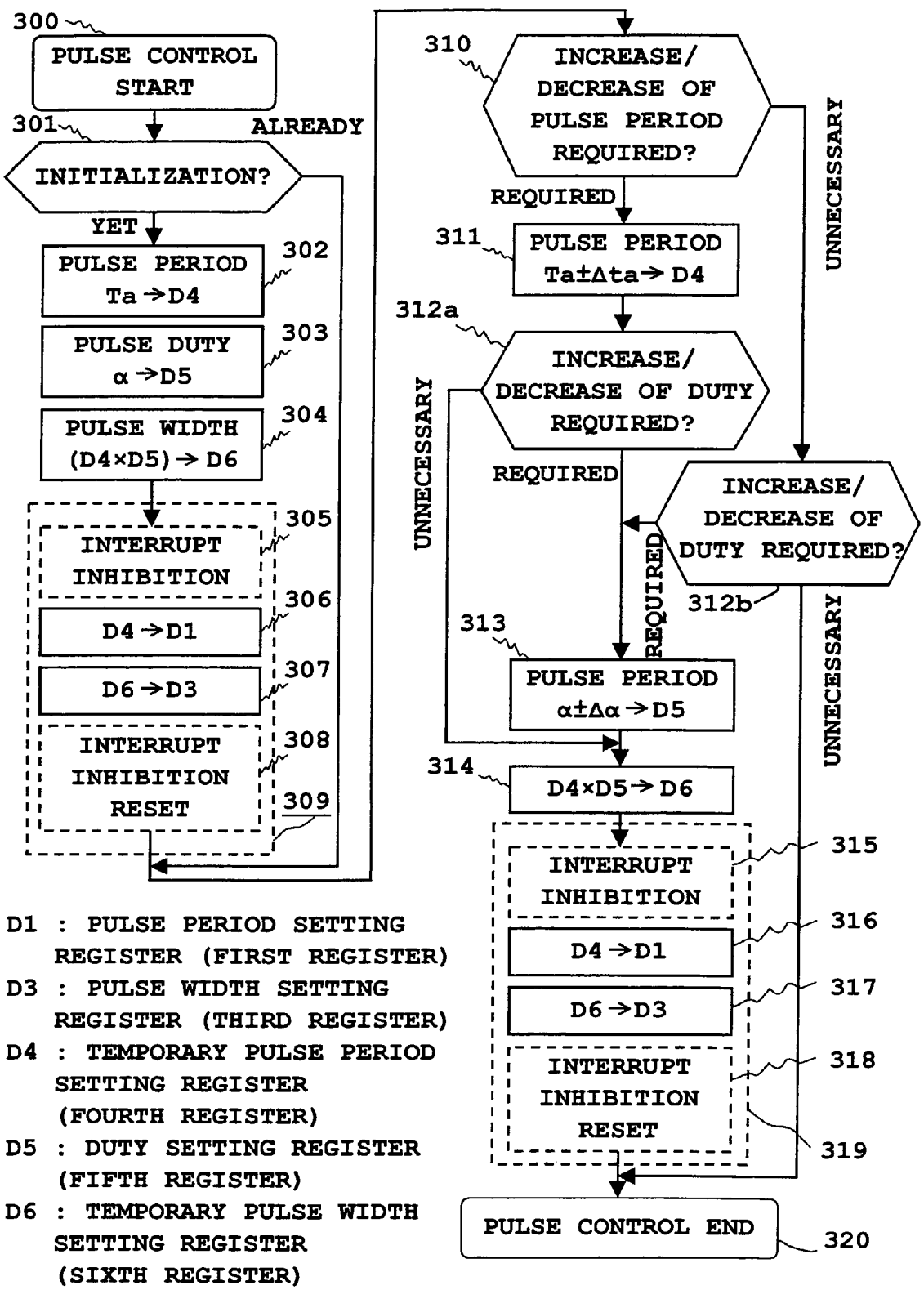
FIG. 3 is a flowchart for explaining operation in the normal routine of the analog input signal processing circuit according to the first embodiment.

FIG. 3 is a flowchart for explaining operation in the normal routine of an analog input signal processing circuit according to the first embodiment shown in FIG. 1.

With reference to FIG. 3, Step 300 is a pulse control start step of the microprocessor 110. This start step 300 is one of the normal control routines in time-sharing processing in the execution process of control programs fit for the use of the microprocessor 110, and is repeatedly activated at intervals of an indefinite time period.

Step 301 is a determination step to be executed subsequently to the start step 300.

In this determination step 301, it is determined whether or not the initialization with respect to the later-described first and third registers D1 and D3 is made depending on whether or not it is the first operation after the power supply has been turned on.

Step 302 is a virtual transfer step to be executed when it is determined in Step 301 that the initialization has not completed yet. In this virtual transfer Step 302, an initial value of a pulse period Ta that is stored in the program memory 111 is transferred to a fourth register D4.

In a transfer step 303 to be executed subsequently to the transfer step 302, an initial value of α pulse duty α that is stored in the program memory 111 is transferred to a fifth register D5.

In a transfer step 304 to be executed subsequently to the transfer step 303, an initial value of a pulse width that is stored in the program memory 111 is transferred to a sixth register D6.

In addition, an initial value of a pulse width to be stored in the sixth register D6 is a value corresponding to a product of an initial value of a pulse width Ta and an initial value of a pulse duty α that are stored in the fourth and fifth registers D4 and D5 respectively.

An interrupt inhibition step 305 to be executed subsequently to the transfer step 304 acts to prevent the microprocessor 110 from making the interrupt operation until the later-described interrupt inhibition reset step 308 is executed.

In a transfer step 306 to be executed subsequently to the interrupt inhibition step 305, contents in the fourth register D4 having been set in the transfer step 302 are transferred to a first register D1.

In a transfer step 307 to be executed subsequently to the transfer step 306, contents of the sixth register D6 having been set in the transfer step 304 are transferred to the third register D3.

An interrupt inhibition reset step 308 to be executed subsequently to the transfer step 307 acts to reset the interrupt inhibition state having been made in the interrupt inhibition step 305, and allows the microprocessor 110 to make the interrupt operation.

A step block 309 consisting of Step 305 through Step 308 is batch transfer means.

In a determination step 310 to be executed when it is determined in Step 301 that the initialization has been made or subsequently to Step 308, it is determined whether or not the increase/decrease of a pulse period Ta is required in the execution process of a control program not shown.

A compensation transfer step 311 to be executed when it is determined in Step 310 that the increase/decrease of a pulse period Ta is required is a first setting means for compensating a set value of a pulse period Ta by the algebraic addition of an required increase/decrease value Δta to a value of a pulse period Ta, which is stored in the fourth register D4, to restore a resultant value in the fourth register D4.

In a determination step 312a to be executed subsequently to Step 311 and in a determination step 312b to be executed when it is determined in Step 310 that the increase/decrease of a pulse period Ta is unnecessary, it is determined whether or not the increase/decrease of a pulse duty α is required in the execution process of a control program not shown.

A compensation transfer step 313 to be executed when it is determined in Step 312a or Step 312b that the increase/decrease of a pulse duty α is required, is a second setting means for compensating a set value of a pulse duty α by the algebraic addition of a required increase/decrease value Δα to a value of a pulse duty α, which is stored in the fifth register D5, to restore a resultant value in the fifth register D5.

Step 314 to be executed when it is determined in Step 312a that the increase/decrease of a pulse duty α is unnecessary or subsequently to Step 313, is pulse width operation setting means that calculates a product of a content of the fourth register D4 and a content of the fifth register D5 at the present time point to store a resultant value in the sixth register D6.

An interrupt inhibition step 315 to be executed subsequently to Step 314 acts to prevent the microprocessor 110 from making the interrupt operation until the later-described interrupt inhibition reset step 318 is executed.

In a transfer step 316 to be executed subsequently to the interrupt inhibition step 315, a content of the fourth register D4 at the present time point is transferred to the first register D1.

In a transfer step 317 to be executed subsequently to the transfer step 316, a content of the sixth register D6 at the present time point is transferred to the third register D3.

An interrupt inhibition reset step 318 to be executed subsequently to the transfer step 317 acts to reset the interrupt inhibition state having been set in the interrupt inhibition step 315 to allow the microprocessor 110 to make the interrupt operation.

Step Block 319 consisting of Step 315 through Step 318 is batch transfer means.

Step 320 is an operation end step to go on when it is determined in Step 312b that the increase/decrease of a pulse duty is unnecessary or subsequently to Step 318. The microprocessor 110 stands by in the operation end step 320, and repeatedly goes to the operation start step 300 again after the other control programs have been executed.

Figure 4:
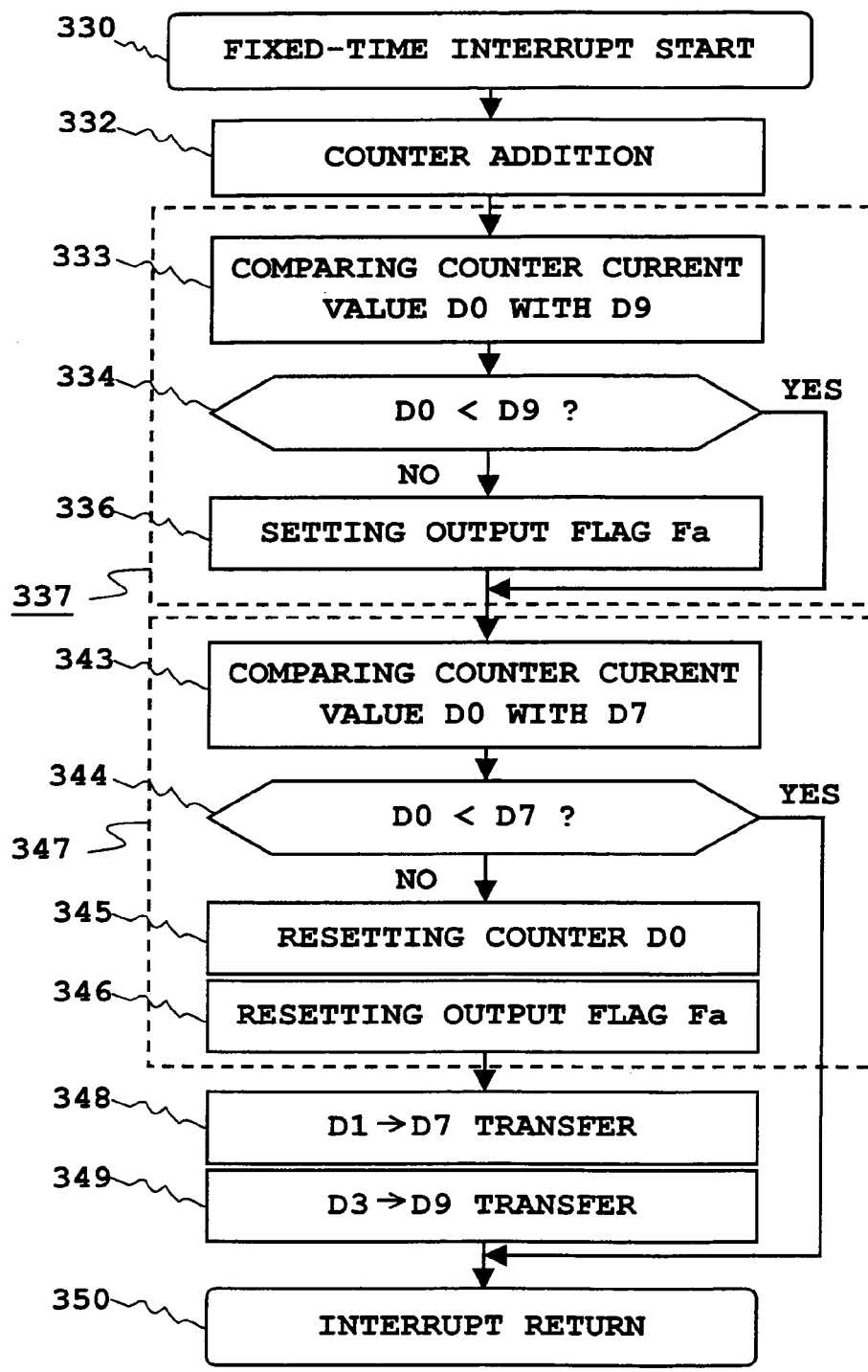
FIG. 4 is a flowchart for explaining operation in the interrupt routine of the analog input signal processing circuit according to the first embodiment.

FIG. 4 is a flowchart for explaining operation in an interrupt routine of the analog input signal processing circuit according to the first embodiment shown in FIG. 1.

With reference to FIG. 4, Step 330 is an interrupt start step to be activated at regular intervals with a counting clock signal, not shown, that is obtained by frequency-dividing a clock signal for making the synchronous operation of a microprocessor 110. When this interrupt start step 330 is activated, the microprocessor 110, which has been running the normal control routine, makes an emergency operation save processing, and thereafter discontinues the execution of the normal control routine, proceeding to Step 332.

However, when the normal control routine is in the interrupt inhibition state, the interrupt operation stands by to proceed to Step 332 at a time point when the interrupt inhibition is reset.

Step 332 acts as interrupt counting means that causes a current value D0 of a counter acting as a memory of a predetermined address in a RAM memory 120 to increase by one count.

A determination step 333 to be executed subsequently to the counting step 332 is a first comparison means for comparing a current value D0 of a counter and a content of a ninth register d9.

In addition, the ninth register D9 is set in the later-described Step 349. When D9 has not been set yet at the time of operation start, a content of D9 is 0.

In a determination step 334 to be executed subsequently to Step 333, comparison result in Step 333 is determined. When it is not D0<D9, that is, a current value D0 of a counter is increased to be not less than a content of the ninth register D9, Step 336 is executed.

In Step 336, an output flag Fa, being a memory of a specified address of the RAM memory 120, is set and a logic level of a control signal pulse train CNTa comes to be "H".

Step Block 337 is flag output generation means consisting of Step 333, Step 334 and Step 336.

Step 343 to be executed when the determination in Step 334 is D0<D9 or subsequently to Step 336 is a second comparison means for comparing a current value D0 of a counter and a content of a seventh register D7.

In addition, the seventh register D7 is set in the later-described Step 348. When D7 has not been set yet at the time of operation start, a content of D7 is 0.

In a determination step 344 to be executed subsequently to Step 343, comparison result in Step 343 is determined. When it is not D0<D7, that is, a current value D0 of a counter is increased to be not less than a content of the ninth register D7, Step 345 is executed.

In Step 345, a current value D0 of a counter is reset to be 0; and in the subsequent Step 346, an output flag Fa having been set in Step 336 is reset. Thus, a logic level of a control signal pulse train CNTa comes to be "L".

Step block 347 acts as reset means consisting of Step 343 through Step 346.

In Step 348 to be executed subsequently to Step 346, a content of the first register D1 is transferred to the seventh register D7. In the subsequent Step 349, a content of the third register D3 is transferred to the ninth register D9.

Step 348 and Step 349 are means for freezing so that the change of a pulse period Ta or a pulse duty α is not accepted during a period of one pulse of control signal pulse being generated.

In an interrupt return step 350 to go on when the determination of Step 344 is D0<D7 or subsequently to Step 349, operation is returned to a position of the normal control routine having been executed at a time point when Step 330 is activated to restart the execution of the normal control routine again.

In the foregoing description, the method for generating a control signal pulse train CNTa is described. However, the method for generating a control signal pulse train CNTb is likewise. Control flows shown in FIGS. 3 and 4 are programmed being overlapped, and an address in a different region of a RAM memory 120 is allocated to the address to use.

In addition, the adjustment of filter characteristics and the adjustment of gain characteristics have respective different objects. The first and second setting means 311 and 313 are not necessarily executed in the same control flow, but rather it is normal to be executed in different control flows.

In this case, on the supposition of directly writing in the first register D1, the second register D2 and the third register D3 without the use of the fourth register D4, the fifth register D5 and the sixth register D6 acting as temporary registers, when the interrupt control made by Step 330 is started during a period from the change of a content of the first register D1 to the change of a content of the third register D3, the calculation is made in the third register D3 processed in Step 333 with an older data content than in the first register D1 processed in Step 343. Thus, the mixed use of old and new data occurs.

However, supposing that temporary information is batch-transferred by batch transfer means 319 immediately after Step 314, data processed in Step 333 and Step 343 are the same, resulting in no occurrence of the mixed use of old and new data.

Further, supposing that Step 316 and Step 317 are executed continuously, the probability of the occurrence of interrupt between these executions is extremely low. Even if there are no interrupt inhibition step 315 and interrupt inhibition-reset step 318 accompanied by this Step 315, there is no serious problem in practical use.

Moreover, although constants stored in the program memory 111 are used as initial set values of pulse periods Ta and Tb, and pulse duties α and β, it is also preferable that values having been learned and stored during the last operation of the microprocessor 110 are used at the operation restart.

As is understood from the foregoing descriptions, the analog input signal processing circuit 101 according to the first embodiment is an analog input signal processing circuit for inputting to a microprocessor 110 a signal related to a signal voltage of a variable analog signal source 100a, 100b, and in which at least a switched capacitor filter circuit 20a, 20b, a gain adjustment circuit 10a, 10b, and a data conversion circuit 30a, 30b are provided in this analog input signal processing circuit; and a non-volatile program memory 111 that cooperates with the mentioned microprocessor 110 includes a program acting as control pulse train generation means.

The mentioned microprocessor 110 is arranged so as to provide a common control signal pulse train CNTa, CNTb to the mentioned switched capacitor filter circuit 20a, 20b and gain adjustment circuit 10a, 10b with the mentioned control pulse train generation means.

The mentioned switched capacitor filter circuit 20a, 20b is a circuit that includes a switching element 21a, 23a 21b, 23b of which switching is controlled with a control signal pulse train CNTa, CNTb commanded from the mentioned microprocessor 110, and a charge/discharge capacitor 22a, 22b; and of which filter characteristics are variable-controlled in response to a pulse frequency of the mentioned control signal pulse train CNTa, CNTb.

The mentioned gain adjustment circuit 10a, 10b is a circuit that is commanded from the mentioned microprocessor 110, that makes the switching control of an amplification factor adjustment switching element 17a, 17b of which switching is controlled with a control signal pulse train CNTa, CNTb, and that makes the variable control of an amplification factor with respect to an input signal voltage in response to a pulse duty α, β, being ON time period/period or OFF time period/period of a control signal pulse train CNTa, CNTb.

The mentioned data conversion circuit 30a, 30b is means that converts a detection current value responsive to a signal voltage of a variable analog signal source, which is obtained via the mentioned switched capacitor filter circuit 20a, 20b and gain adjustment circuit 10a, 10b, to a digital logic signal to input it to the mentioned microprocessor, and that writes it in a RAM memory 120 acting as a detection data memory via this microprocessor 110.

The mentioned control pulse train generation means is formed of: a first setting means 311 for changing and setting a pulse period; a second setting means 313 for changing and setting a pulse duty; pulse width operation setting means 314 for calculating and setting a product of a pulse period and a pulse duty having been changed and set by the first setting means 311 and the second setting means 313; interrupt counting means 332 for counting the number of times of fixed-time interrupts; flag output generation means 337 in which flag is set when a counter current value of this interrupt counting means 332 has reached a set value calculated by the mentioned pulse width operation setting means 314; and reset means 347 for initializing the mentioned counter current value to reset a flag output when a counter current value of the mentioned interrupt counting means 332 has reached a pulse period that is variable-set by the mentioned first setting means 311; and in which a flag output from the mentioned flag output generation means 337 is a control signal pulse train.

As a result, according to this first embodiment, frequency characteristics of an input filter that is located in a signal input circuit can be adjusted without restraint by means of a microprocessor; and the entire gain of an input circuit can be adjusted using the same control signal. Thus, it is possible to reduce the number of signals output from the microprocessor.

Furthermore, even if a period of a control signal pulse train is changed and filter characteristics are changed, in case of no change in duty, a gain of the input circuit is not changed. On the contrary, even if a duty of a control signal pulse train is changed and a gain of the input circuit is changed, in case of no change in period, filter characteristics are not changed. Thus, it becomes possible to make the mutually independent adjustment.

Furthermore, it is arranged such that a flag output to be outputted from the flag output generation means is a control signal pulse train, so that it is possible to control with accuracy a pulse period or a pulse width of control signals. In addition, due to the use of a control signal pulse train of high-speed operation, it is possible to cause a capacitor used in a switched capacitor filter or a gain adjustment circuit to be of small capacity, small size, and low price.

According to this first embodiment, in the mentioned control pulse train generation means, the first setting means 311, the second setting means 313, and pulse width operation setting means 314 are processed in the normal control routine acted by no interrupt operation; and interrupt counting means 332, flag output generation means 337, and reset means 347 are processed in the fixed-time interrupt control routine.

As a result, programs necessary to be executed in the fixed-time interrupt control routine are reduced, and no complicated command such as multiplication or division is included in the interrupt program. Thus, it is possible to shorten an execution time period of the interrupt control program, and to reduce the load of a microprocessor.

Further, according to this first embodiment, the mentioned control pulse train generation means further comprises batch transfer processing means 309, 319; and the mentioned batch transfer processing means 309, 319 employs a pair of operation registers D1 and D3 that is batch-written so that a set value of a pulse period that is processed by the mentioned flag output generation means 337 and a set value of a pulse period that is processed by reset means 347, are the same pulse period.

As a result, it is possible to prevent the mixed use of a pulse period based on the pulse period having been changed and set previous time and a pulse period of which setting is newly changed, and thus to prevent occurrence of an inaccurate control signal pulse train.

According to this first embodiment, a data conversion circuit is an analog comparison circuit 30a, 30b, and a program memory 111 that cooperates with the mentioned microprocessor 110 includes a program acting as equivalent change means of a comparison reference voltage.

The mentioned analog comparison circuit 30a, 30b compares a detection current value of an analog signal voltage that is obtained via the mentioned switched capacitor filter circuit 20a, 20b and gain adjustment circuit 10a, 10b with a predetermined comparison reference voltage 31a, 31b to input this comparison result to the mentioned microprocessor 110 as a digital logic signal DIa, DIb.

The mentioned equivalent change means is means for obtaining an analog comparison circuit 30a, 30b with a comparison reference voltage 31a, 31b that is equivalently changed by changing a pulse duty of the mentioned control signal pulse train CNTa, CNTb to change an input/output ratio of a gain adjustment circuit 10a, 10b.

As a result, even if a comparison reference voltage 31a, 31b is a fixed value, it is possible to change and adjust a virtual comparison reference voltage by adjusting an amplification factor of the gain adjustment circuit 10a, 10b.

Furthermore, according to this first embodiment, the mentioned switched capacitor filter circuit 20a, 20b forms a low-pass filter circuit for interrupting a high-frequency noise signal; and a smoothing filter circuit 19a, 19b of a smaller integration time constant than the minimum integration time constant of the switched capacitor filter is provided in an output stage of the mentioned gain adjustment circuit 10a, 10b.

As a result, it is possible to adjust without restraint frequency characteristics of a noise filter located in the signal input circuit with the microprocessor 110, and it is possible to independently adjust an amplification factor of the input circuit using the same control signal pulse train CNTa, CNTb.

EMBODIMENT 2

Figure 5:
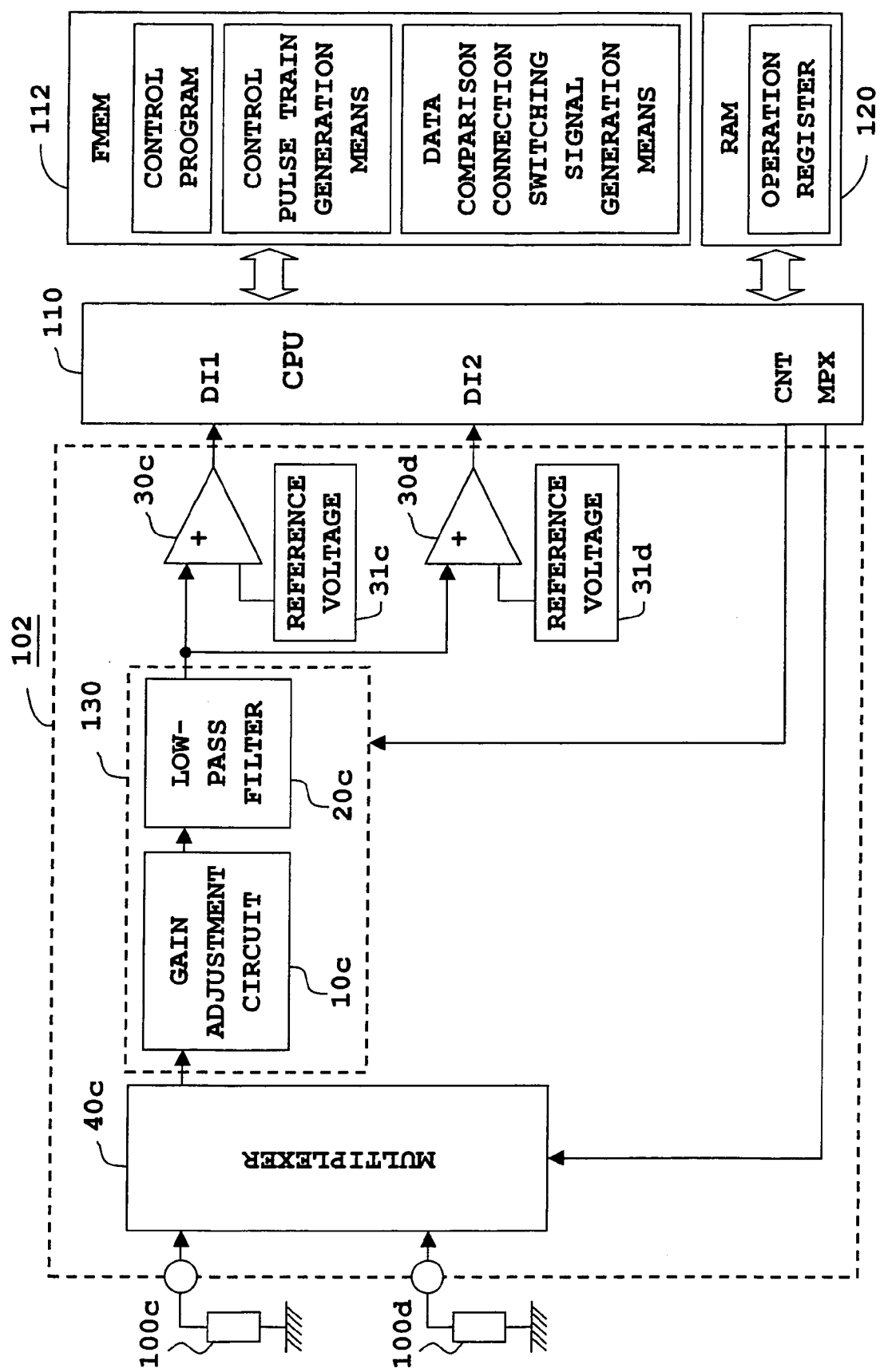
FIG. 5 is a diagram showing the entire circuit arrangement of an analog input signal processing circuit according to a second embodiment.

FIG. 5 is a diagram sowing the entire circuit arrangement of an analog input signal processing circuit according to a second embodiment of the invention.

Hereinafter, the descriptions are made with emphasis on points different from the analog input signal processing circuit according to the first embodiment.

As shown in FIG. 5, an analog input signal processing circuit 102 according to the second embodiment is provided between variable analog signal sources 100c and 100d and a microprocessor 110.

In a non-volatile program memory 112 such as flash memory, which is bus-connected to the microprocessor 110, stored are programs acting as control pulse train generation means, equivalent change means, and connection switching signal generation means, and control programs fit for the use of the microprocessor 110.

The analog input signal processing circuit 102 according to the second embodiment comprises a gain adjustment circuit 10c, a switched capacitor filter circuit 20c forming a low-pass filter circuit, first and second comparison circuits 30c and 30d acting as data conversion circuits, and a multiplexer 40c. Comparison result between a variable analog signal source 100c and comparison reference voltages 31c and 31d are inputted to the microprocessor 110 as digital logic signals DI1 and DI2, and the comparison result is stored in a RAM memory 120.

This second embodiment is characterized in that the multiplexer 40c is located. When the multiplexer 40c switches the connection of variable analog signal sources from 100c to 100d in response to a connection switching signal MPX, which the microprocessor 110 generates, comparison result of the variable analog signal source 100d and comparison reference voltages 31c and 31d is inputted to the microprocessor 110 as digital logic signals DI1 and DI2, and stored in the region of a different address of the RAM memory 120.

Equivalent change means is means for obtaining the analog comparison circuits 30c and 30d with comparison reference voltages having been equivalently changed by changing a pulse duty of a control signal pulse train CNT to change an input/output ratio of the gain adjustment circuit 10c.

Details of the gain adjustment circuit 10c and the switched capacitor filter circuit 20c forming a low-pass filter circuit is the same as those of the gain adjustment circuit 10a and the switched capacitor filter circuit 20a of FIG. 1.

However, a control signal pulse train CNT is provided from the microprocessor 110 to a circuit block 130c formed of the gain adjustment circuit 10c and the switched capacitor filter circuit 20c.

Generation means of a control signal pulse train CNT is the same as that of a control signal pulse train CNTa in FIG. 1, and is as shown in the flowcharts of FIGS. 3 and 4.

Connection switching signal generation means is means that sequentially generates a connection switching signal MPX with respect to the multiplexer 40c, and that separates and writes data to be written in the RAM memory 120 via the first and second comparators 30c and 30d acting as data conversion circuits and the microprocessor 110 with respect to each of a plurality of variable analog signal sources 100c and 100d.

An analog comparison circuit according to this second embodiment is formed of the first and second comparison circuits 30c and 30d. A second comparison reference voltage 31d used in the second comparison circuit 30d is set to be a larger value as compared with a first comparison reference voltage 31c used in the first comparison circuit 30c.

As a result, signal voltage levels of the variable analog signal source 100c or 100d may be classified as small, medium or large, and determined by means of the microprocessor 110.

Thus, in the case of the embodiment as shown in FIG. 1, the determination of multistage levels can be achieved by discriminating and reading comparison determination results while pulse duties α being changed and adjusted alternately to be large or small.

However, in the application of making the comparison determination while switching the connection of a number of analog signal sources with the multiplexer 40c as the second embodiment of FIG. 5, it is desirable that multistages of analog comparison circuits are located for the purpose of improving responsibility of comparison determination.

As is understood from the above descriptions, the analog signal processing circuit according to the second embodiment, as in the case of the foregoing first embodiment, is an analog input signal processing circuit for inputting to a microprocessor 110 a signal related to a signal voltage of a variable analog signal source 100c, 100d, and in which at least a switched capacitor filter circuit 20c, a gain adjustment circuit 10c, and a data conversion circuit 30c, 30d are provided in this analog input signal processing circuit; and a non-volatile program memory 112 that cooperates with the mentioned microprocessor 110 includes a program acting as control pulse train generation means.

The mentioned microprocessor 110 is arranged so as to provide a common control signal pulse train CNT to the mentioned switched capacitor filter circuit 20c and gain adjustment circuit 10c with the mentioned control pulse train generation means.

The mentioned switched capacitor filter circuit 20c is a circuit that includes a switching element of which switching is controlled with a control signal pulse train CNT commanded from the mentioned microprocessor 110, and a charge/discharge capacitor; and of which filter characteristics are variable-controlled in response to a pulse frequency of the mentioned control signal pulse train CNT.

The mentioned gain adjustment circuit 10c is a circuit that is commanded from the mentioned microprocessor 110, that makes the switching control of an amplification factor adjustment switching element of which switching is controlled with a control signal pulse train CNT, and that makes the variable control of an amplification factor with respect to an input signal voltage in response to a pulse duty, being ON time period/period or OFF time period/period of a control signal pulse train CNT.

The mentioned data conversion circuit 30c, 30d is means that converts a detection current value responsive to a signal voltage of a variable analog signal source, which is obtained via the mentioned switched capacitor filter circuit 20c and gain adjustment circuit 10c, to a digital logic signal D1, D2 to input it to the mentioned microprocessor 110, and that writes it in a RAM memory 120 acting as a detection data memory via this microprocessor 110.

The mentioned control pulse train generation means is formed of: a first setting means 311 for changing and setting a pulse period; a second setting means 313 for changing and setting a pulse duty; pulse width operation setting means 314 for calculating and setting a product of a pulse period and a pulse duty having been changed and set by the first setting means 311 and the second setting means 313; interrupt counting means 332 for counting the number of times of fixed-time interrupts; flag output generation means 337 in which flag is set when a counter current value of this interrupt counting means 332 has reached a set value calculated by the mentioned pulse width operation setting means 314; and reset means 347 for initializing the mentioned counter current value to reset a flag output when a counter current value of the mentioned interrupt counting means 332 has reached a pulse period that is variable-set by the mentioned first setting means 311; and in which a flag output from the mentioned flag output generation means 337 is a control signal pulse train.

As a result, as in the foregoing first embodiment, frequency characteristics of an input filter that is located in a signal input circuit can be adjusted without restraint by means of a microprocessor; and the entire gain of an input circuit can be adjusted using the same control signal. Thus, it is possible to reduce the number of signals output from the microprocessor.

Further, even if a period of a control signal pulse train is changed and filter characteristics are changed, in case of no change in duty, a gain of the input circuit is not changed. On the contrary, even if a duty of a control signal pulse train is changed and a gain of the input circuit is changed, in case of no change in period, filter characteristics are not changed. Thus, it becomes possible to make the mutually independent adjustment.

Furthermore, it is arranged such that a flag output to be outputted from the flag output generation means is a control signal pulse train, so that it is possible to control with accuracy a pulse period or a pulse width of control signals.

In addition, due to the use of a control signal pulse train of high-speed operation, it is possible to cause a capacitor used in a switched capacitor filter or a gain adjustment circuit to be of small capacity, small size, and low price.

According to this second embodiment, the mentioned data conversion circuit is first and second comparison circuits 30c and 30d, and a program memory 112 that cooperates with the mentioned microprocessor 110 includes a program acting as equivalent change means of a comparison reference voltage.

The mentioned first and second comparison circuits 30c, 30d compare a detection current value of an analog signal voltage that is obtained via the mentioned switched capacitor filter circuit 20c and gain adjustment circuit 10c with a predetermined comparison reference voltage 31c, 31d to input this comparison result to the mentioned microprocessor 110 as a digital logic signal DI1, DI2.

The mentioned equivalent change means is means for obtaining the first and second comparison circuits 30c, 30d with a comparison reference voltage 31c, 31d that is equivalently changed by changing a pulse duty of the mentioned control signal pulse train CNT to change an input/output ratio of a gain adjustment circuit 10c.

As a result, even if the first and second comparison reference voltage 31c, 31d is a fixed value, it is possible to change and adjust a virtual comparison reference voltage by adjusting an amplification factor of the gain adjustment circuit 10c.

According to this second embodiment, the mentioned analog comparison circuit comprises at least a first and second of plural comparison circuits 30c and 30d; the mentioned first comparison circuit 30c compares a detection current value of an analog signal voltage that is obtained via the mentioned switched capacitor filter circuit 20c and gain adjustment circuit 10c with a first comparison reference voltage 31c to input this comparison result to the mentioned microprocessor 110 as a first comparison result DI1; and the mentioned second comparison circuit 30d compares a detection current value of an analog signal voltage that is obtained via the mentioned switched capacitor filter circuit 20c and gain adjustment circuit 10c with a second comparison reference voltage 31d, being a value larger than the mentioned first comparison reference voltage 31c to input this comparison result to the mentioned microprocessor 110 as a second comparison result DI2.

As a result, it is possible to speedily determine signal voltages of the variable analog signal sources 100c and 100d at multistage levels.

According to this second embodiment, the mentioned switched capacitor filter circuit 20c forms a low-pass filter circuit for interrupting a high-frequency noise signal; and a smoothing filter circuit of a smaller integration time constant than the minimum integration time constant of the switched capacitor filter is provided in an output stage of the mentioned gain adjustment circuit 10c.

As a result, it is possible to adjust without restraint frequency characteristics of a noise filter located in the signal input circuit with the microprocessor 110, and it is possible to independently adjust an amplification factor of the input circuit using the same control signal pulse train CNT.

Further, according to this second embodiment, the mentioned variable analog signal source includes a plurality of variable analog signal sources 100c and 100d to be selected and connected to the foremost stage of the mentioned switched capacitor filter circuit 20c and gain adjustment circuit 10c in sequence via a multiplexer 40c; a program memory 112 that cooperates with the mentioned microprocessor 110 includes a program acting as connection switching signal generation means; and the mentioned connection switching signal generation means is means that sequentially generates a connection switching signal with respect to the mentioned multiplexer 40c, and that separates and writes data to be written in a RAM memory 120 via the mentioned first and second comparison circuits 30c and 30d acting as a data conversion circuit and the mentioned microprocessor 110 with respect to each of a plurality of variable analog signal sources.

As a result, it is characteristic that even if a number of variable analog signal sources are connected, the number of the switched capacitor filter circuit 20c, the gain adjustment circuit 10c, or the first and second comparison circuits 30c and 30d acting as a data conversion circuit is not increased, and two numbers of inputs to the microprocessor 110 are enough. Besides, in the case where the change in signal voltages of the variable analog signal sources 100c and 100d is slow, and an integration time constant of the switched capacitor filter 20c acting as a low-pass filer is comparatively short, even when the variable analog signal sources have individually different maximum signal voltage levels, it is possible to make the unified maximum signal voltage level to be inputted to the first and second comparison circuits 30c and 30d acting as a data conversion circuit by individually changing an amplification factor of the gain adjustment circuit 20c.

EMBODIMENT 3

Figure 6:
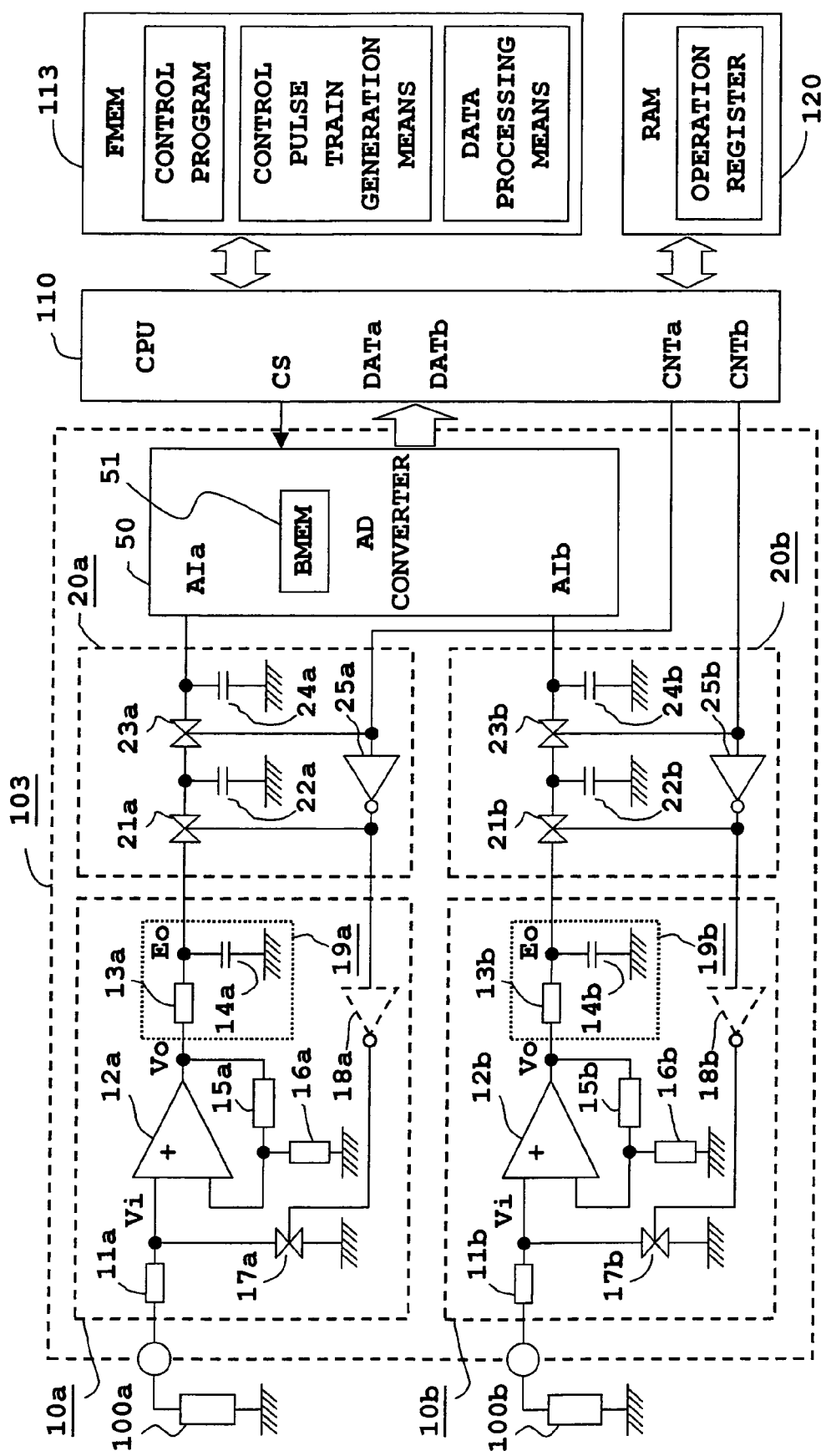
FIG. 6 is a diagram showing the entire circuit arrangement of an analog input signal processing circuit according to a third embodiment.

FIG. 6 is a diagram showing the entire circuit arrangement of an analog input signal processing circuit according to a third embodiment of the invention.

Hereinafter, the descriptions are made with emphasis on points different from the analog input signal processing circuit according to the foregoing first embodiment.

As shown in FIG. 6, an analog input signal processing circuit 103 according to this third embodiment is provided between variable analog signal sources 100a and 100b and a microprocessor 110.

The analog input signal processing circuit 103 according to this third embodiment comprises gain adjustment circuits 10a and 10b, switched capacitor filter circuits 20a and 20b forming a low-pass filter circuit, and an AD converter 50 acting as a data conversion circuit. Input voltages from the analog signal sources 100a and 100b are digital-converted with the AD converter 50 to be inputted to the microprocessor 110.

Details of the gain adjustment circuits 10a and 10b and the switched capacitor filter circuits 20a and 20b are the same as those in FIG. 1. The AD converter 50, however, is a multi-channel AD converter that digital-converts a number of analog input signals and sequentially stores them in a buffer memory 51. The microprocessor 110 generates chip select signals CS, fetches a digital-converted data DATa or DATb of a specified input, and stores them in a RAM memory 120.

In a non-volatile program memory 113 such as flash memory bus-connected to the microprocessor 110, stored are programs acting as control pulse train generation means, and data processing means, and control programs fit for the uses of the microprocessor 110.

Generation means of control signal pulse trains CNTa and CNTb are the same as the control signal pulse trains CNTa and CNTb in FIG. 1, and as shown in the flowcharts of FIGS. 3 and 4.

The data processing means is means that transfers and stores digital outputs from the AD converter 50 in the RAM memory 120 as detection digital voltages, and that equivalently changes comparison reference digital voltages with respect to detected digital voltages by changing pulse duties α and β of control signal pulse trains CNTa and CNTb to change an input/output ratio of the gain adjustment circuits 10a and 10b.

As is understood from the above descriptions, the analog input signal processing circuit 103 according to the third embodiment is an analog input signal processing circuit for inputting a signal related to a signal voltage of a variable analog signal source 100a, 100b to a microprocessor 110, and at least a switched capacitor filter circuit 20a, 20b, a gain adjustment circuit 10a, 10b, and a data conversion circuit 50 are provided in this analog input signal processing circuit; and a non-volatile program memory 113 that cooperates with the mentioned microprocessor 110 includes a program acting as control pulse train generation means.

The mentioned microprocessor 110 is arranged so as to provide a common control signal pulse train CNTa, CNTb to the mentioned switched capacitor filter circuit 20a, 20b and gain adjustment circuit 10a, 10b with the mentioned control pulse train generation means.

The mentioned switched capacitor filter circuit 20a, 20b is a circuit which includes a switching element 21a, 23a and 21b, 23b of which switching is controlled with a control signal pulse train CNTa, CNTb commanded from the mentioned microprocessor 110, and a charge/discharge capacitor 22a, 22b; and of which filter characteristics are variable-controlled in response to a pulse frequency of the mentioned control signal pulse train CNTa, CNTb.

The mentioned gain adjustment circuit 10a, 10b is a circuit that is commanded from the mentioned microprocessor 110, that makes the switching control of an amplification factor adjustment switching element 17a, 17b of which switching is controlled with a control signal pulse train CNTa, CNTb, and that makes the variable control of an amplification factor with respect to an input signal voltage in response to a pulse duty α, β, being ON time period/period or OFF time period/period of the control signal pulse train CNTa, CNTb.

The mentioned data conversion circuit 50 is means that converts a detection current value responsive to a signal voltage of a variable analog signal source, which is obtained via the mentioned switched capacitor filter circuit 20a, 20b and gain adjustment circuit 10a, 10b, to a digital logic signal to input it to the mentioned microprocessor 110, and that writes it in a RAM memory 120 acting as a detection data memory via this microprocessor 110.

The mentioned control pulse train generation means is formed of: a first setting means 311 for changing and setting a pulse period; a second setting means 313 for changing and setting a pulse duty; pulse width operation setting means 314 for calculating and setting a product of a pulse period and a pulse duty having been changed and set by the first setting means 311 and the second setting means 313; interrupt counting means 332 for counting the number of times of fixed-time interrupts; flag output generation means 337 in which flag is set when a counter current value of this interrupt counting means 332 has reached a set value calculated by the mentioned pulse width operation setting means 314; and reset means 347 for initializing the mentioned counter current value to reset a flag output when a counter current value of the mentioned interrupt counting means 332 has reached a pulse period that is variable-set by the mentioned first setting means 311; and in which a flag output from the mentioned flag output generation means 337 is a control signal pulse train.

As a result, as in the foregoing first embodiment or the second embodiment, it is possible to reduce the number of signals output from the microprocessor; and it is possible to make the mutually independent adjustment of gain and filter characteristics.

Furthermore, it is possible to control with accuracy a pulse period or a pulse width of control signals; and, due to the use of a control signal pulse train of high-speed operation, it is possible to cause a capacitor used in a switched capacitor filter or a gain adjustment circuit to be of small capacity, small size, and low price.

According to this third embodiment, the mentioned data conversion circuit is an AD converter 50, and a program memory 113 that cooperates with the mentioned microprocessor 110 includes a program acting as data processing means; the mentioned AD converter 50 converts an analog signal voltage that is obtained via the mentioned switched capacitor filter circuit 20a, 20c and gain adjustment circuit 10a, 10b to plural bits of digital data to input it as a digital logic signal with respect to the mentioned microprocessor 110; and the mentioned data processing means transfers and stores a digital output from the mentioned AD converter 50 in a RAM memory 120 as a detection digital voltage, and equivalently changes a comparison reference digital voltage with respect to the mentioned detection digital voltage by changing a pulse duty α, β of the mentioned control signal pulse train CNTa, CNTb to change an input/output ratio of the gain adjustment circuit 10a, 10b.

As a result, it is possible for the microprocessor 110 to calculate a deviation between a digital conversion value having been inputted and a comparison reference digital voltage. Further, even if a comparison reference digital voltage remains to be a comparatively large value, making a larger amplification factor of the gain adjustment circuit 10a and 10b corresponds to that an equivalently small comparison reference digital voltage is virtually set. Thus, it is possible to avoid the use in the low power region to improve a digital conversion accuracy of the AD converter 50.

According to this third embodiment, the mentioned AD converter 50 is a multi-channel AD converter; the mentioned switched capacitor filter circuit 20a, 20b, gain adjustment circuit 10a, 10b, and control signal pulse train CNTa, CNTb are provided individually with respect to each of a plurality of variable analog signal sources 100a, 100b; and the mentioned AD converter 50 makes the digital conversion in sequence taking a plurality of analog signal voltages as inputs.

As a result, since one control signal corresponds to each variable analog signal source 100a, 100b, the number of input signals of a microprocessor is the same as the number of variable analog signal sources 100a and 100b, thus enabling to process a large number of variable analog signal sources. Further, even if variable analog signal sources 100a and 100b have individually different maximum signal voltages, an amplification factor of each gain adjustment circuit 10a, 10b is adjusted so that the maximum voltage of each variable analog signal source and the maximum input voltage of the AD converter 50 are substantially identical, thereby enabling to improve a digital conversion accuracy of the AD converter 50.

According to this third embodiment, the mentioned switched capacitor filter circuit 20a, 20b forms a low-pass filter circuit for interrupting a high-frequency noise signal; and a smoothing filter circuit 19a, 19b of a smaller integration time constant than the minimum integration time constant of the switched capacitor filter is provided in the output stage of the mentioned gain adjustment circuit 10a, 10b.

As a result, it is possible to adjust without restraint frequency characteristics of a noise filter that is located in the signal input circuit with the microprocessor 110; and it is possible to adjust independently an amplification factor of the input circuit using the same control signal pulse trains CNTa and CNTb.

EMBODIMENT 4

Figure 7:
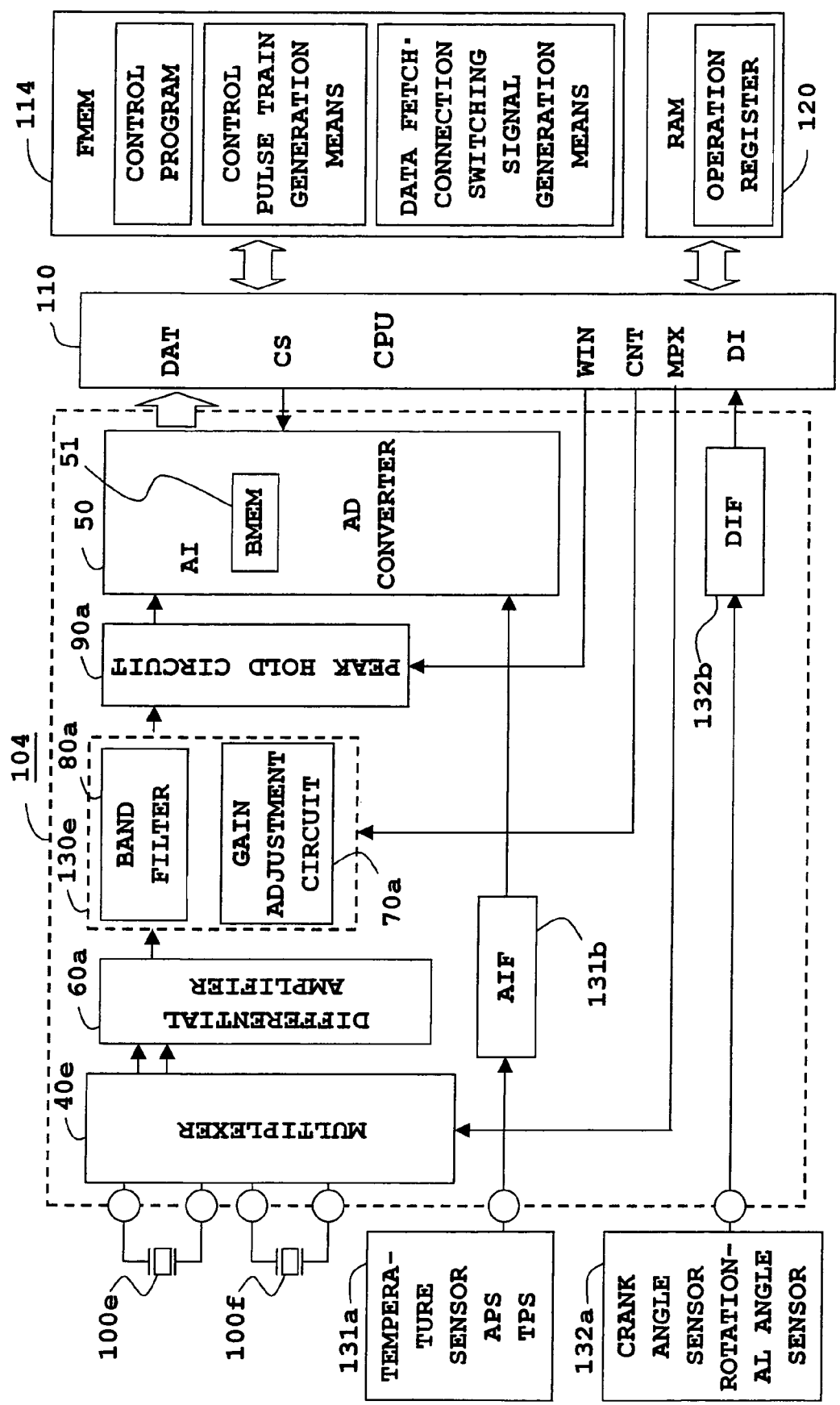
FIG. 7 is a diagram showing the entire circuit arrangement of an analog input signal processing circuit according to a fourth embodiment.

FIG. 7 is a diagram showing the entire circuit arrangement of an analog input signal processing circuit according to a fourth embodiment of the invention.

As shown in FIG. 7, an analog input signal processing circuit 104 according to this fourth embodiment is provided between variable analog signal sources 100e and 100f, for example, knock sensor for detecting the vibration of an engine and a microprocessor 110 forming an engine control device.

Figure 8:
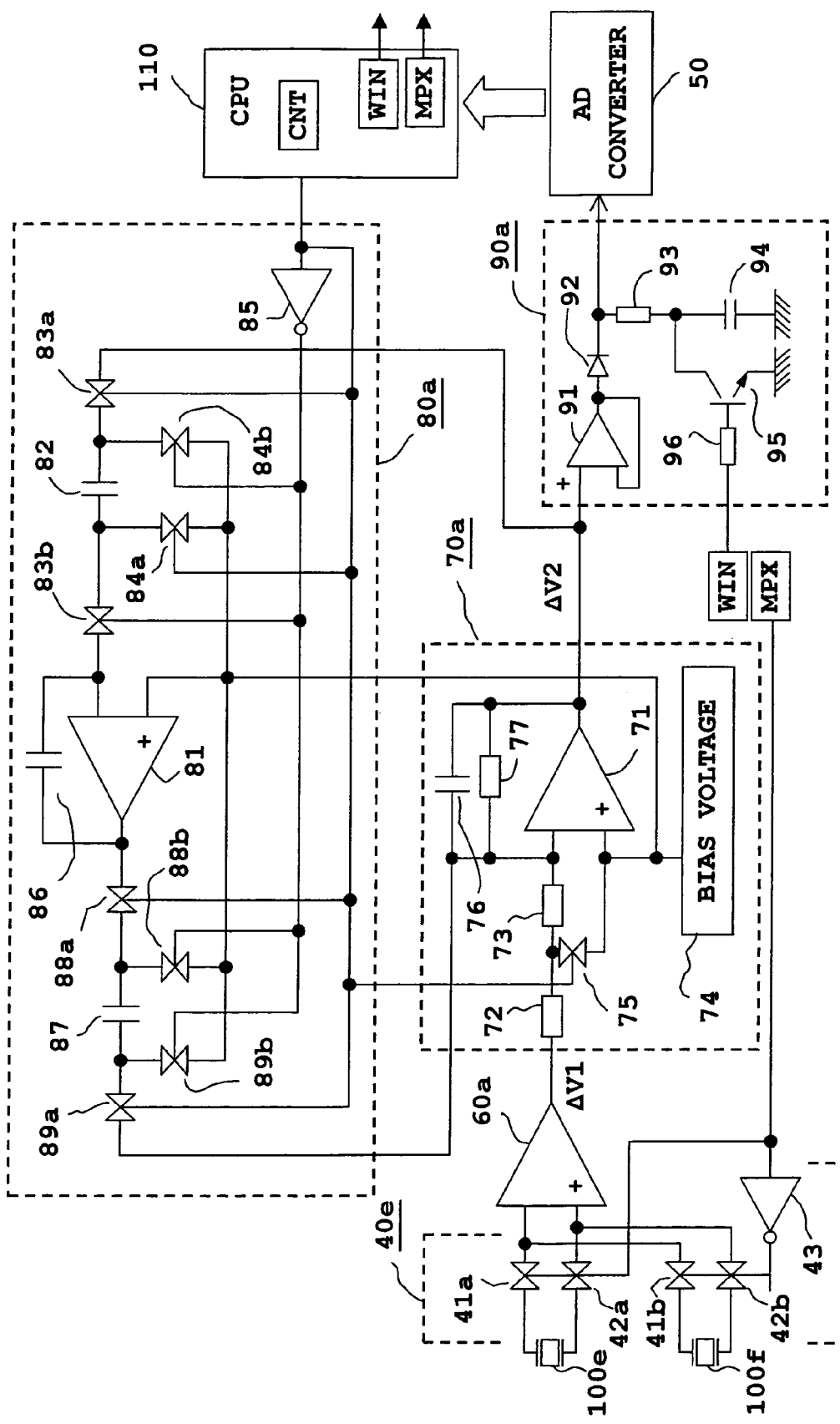
FIG. 8 is a diagram showing the detailed arrangement of a main section of FIG. 7.

In addition, FIG. 8 is a diagram showing the detailed arrangement of a main section of FIG. 7.

In the analog input signal processing circuit 104 according to the fourth embodiment, a multiplexer 40e of which detailed arrangement is shown in FIG. 8, a differential amplifier 60a, a circuit block 130e formed of a gain adjustment circuit 70a and a band filter circuit 80a, a peak hold circuit 90a, and an AD converter 50 acting as a data conversion circuit are sequentially connected. The band filter circuit 80a is formed of a switched capacitor filter.

An analog sensor 131a is a sensor group of a cooling water temperature sensor of the engine, an outside air temperature sensor, an accelerator position sensor, a throttle position sensor and the like. This analog sensor 131a is connected to an analog input terminal of a multi-channel AD converter 50 via an interface circuit 131b. Data having been sequentially digital-converted are stored in a buffer memory 51.

A switching sensor 132a is a switch group making various ON/OFF operations of, e.g., a crank angle sensor or a rotation sensor of the engine, and is connected to an input port DI of the microprocessor 110 via an interface circuit 132b.

The microprocessor 110 discriminates and reads a number of digital-converted data in the buffer memory 51 with chip select signals CS, and transfers them to the RAM memory 120. Further, the microprocessor 110 provides a fetch timing signal WIN to the peak hold circuit 90b, provides a connection switching signal MPX to the multiplexer 40e, and provides a control signal pulse train CNT to the gain adjustment circuit 70b and the switched capacitor filter 80b acting as a band filter circuit.

In a non-volatile program memory 114 such as flash memory bus-connected to the microprocessor 110, stored are programs acting as the later-described control pulse train generation means, data processing means, data fetch signal generation means, and connection switching signal generation means, and control programs fit for the use of the microprocessor 110 in order to make the engine control.

In addition, the data processing means is means that transfers and stores digital outputs from the AD converter 50 in the RAM memory 120 as detection digital voltages, and that equivalently changes comparison reference digital voltages with respect to detected digital voltages by changing a pulse duty γ of a control signal pulse train CNT to change an input/output ratio of the gain adjustment circuit 70a.

The data fetch signal generation means is means that, after a predetermined period has passed from which a later-described discharge switching element 95 is brought in a closed circuit to discharge an electric charge having been charged of the mentioned maximum value storing capacitor 94, and the discharge switching element 95 is brought in an open circuit to charge the maximum value storing capacitor 94 again, periodically generates fetch timing signals with which digital logic signals related to a charging voltage of this maximum value storing capacitor 94 are transferred and stored in the RAM memory 120 via the AD converter 50 acting as a data conversion circuit and the microprocessor 110.

The connection switching signal generation means is means that sequentially generates connection switching signals MPX with respect to a multiplexer 40e, and that separates and writes data to be written in the RAM memory 120 via the AD converter 50 acting as a data conversion circuit and the microprocessor 110 with respect to each of a plurality of variable analog signal sources.

In a RAM memory 120 for arithmetic processing that is bus-connected to the microprocessor 110, digital-converted values of various analog inputs having been digital-converted with the AD converter 50 are stored, or operational data to be used by control signal pulse train generation means are stored.

With reference to FIG. 8 showing details of an input processing circuit of the variable analog signal sources 100e and 100f, the multiplexer 40e is formed of selection switching elements 41a and 42a providing a connection between the variable analog signal source 100e and a differential amplifier 60a, selection switching elements 41b and 42b providing a connection between the variable analog signal source 100f and the differential amplifier 60a, and an inverter 43. When a logic level of a connection-switching signal MPX, which the microprocessor 110 generates, is "H", the selection switching elements 41a and 42a are brought in conduction. When a logic level of a connection-switching signal MPX is "L", the selection switching elements 41b and 42b to be driven through the inverter 43 are brought in conduction.

An amplifier 71 that is located in the gain adjustment circuit 70a has an inverting input connected to an output terminal of the differential amplifier 60a via input resistors 72 and 73. The amplifier 71 has a non-inverting input to which a bias voltage 74, for example, of DC 2.5V is applied.

In addition, an amplification factor adjustment switching element 75 is connected between a connection position of the input resistors 72 and 73 and a non-inverting terminal of the amplifier 71. An integrating capacitor 76 and a feedback resistor 77 are connected in parallel between an output terminal and an inverting input terminal of the amplifier 71.

An amplifier 81 that is located in the switched capacitor filter circuit 80a has a non-inverting input to which a bias voltage 74 is connected, and an inverting input to which a charge/discharge capacitor 82 is connected.

This charge/discharge capacitor 82 is arranged so as to be connected between the output terminal and the non-inverting input terminal of the amplifier 71 when the switching elements 83a and 84a are in conduction, and so as to be connected between the inverting input terminal and the non-inverting input terminal of the amplifier 81 when switching elements 83b and 84b are in conduction.

Additionally, the amplification factor adjustment switching element 75 and the switching elements 83a and 84a are in conduction when a control signal pulse train CNT that the microprocessor 110 generates is at a logic level "H". The switching elements 83b and 84b to be driven through the inverter 85 are in conduction when a control signal pulse train CNT is at a logic level "L".

An integrating capacitor 86 is connected between the inverting input terminal and the output terminal of an amplifier 81. A charge/discharge capacitor 87 is brought in electrical connection between the output terminal of the amplifier 81 and the inverting input terminal of the amplifier 71 when switching elements 88a and 89a to be conducted when a logic level of a control signal pulse train CNT is "H" are in conduction. When switching elements 88b and 89b to be driven from the inverter 85 are brought in conduction instead of the switching elements 88a and 89a, both ends of the charge/discharge capacitor 87 come to be short-circuited and discharged.

An amplifier 91 that is located in the peak hold circuit 90a has a non-inverting input connected to the output terminal of the amplifier 71, and has an output connected to the maximum value storing capacitor 94 via a reverse-current blocking diode 92 and a charge resistor 93. A voltage across a series circuit of these capacitor 94 and charge resistor 93 is inputted to the microprocessor 110 via the AD converter 50.

A transistor 95 acting as a discharge switching element is driven to be conducted via a drive resistor 96 when a logic level of a fetch timing signal WIN that the microprocessor 110 generates is "H" to bring the maximum value storing capacitor 94 in short circuit to discharge. After a predetermined time period has passed from which a fetch timing signal WIN comes to be at the logic level "L" and the discharge switching element 95 is in non-conducting state, the microprocessor 110 reads an output voltage from the AD converter 50.

Figure 9:
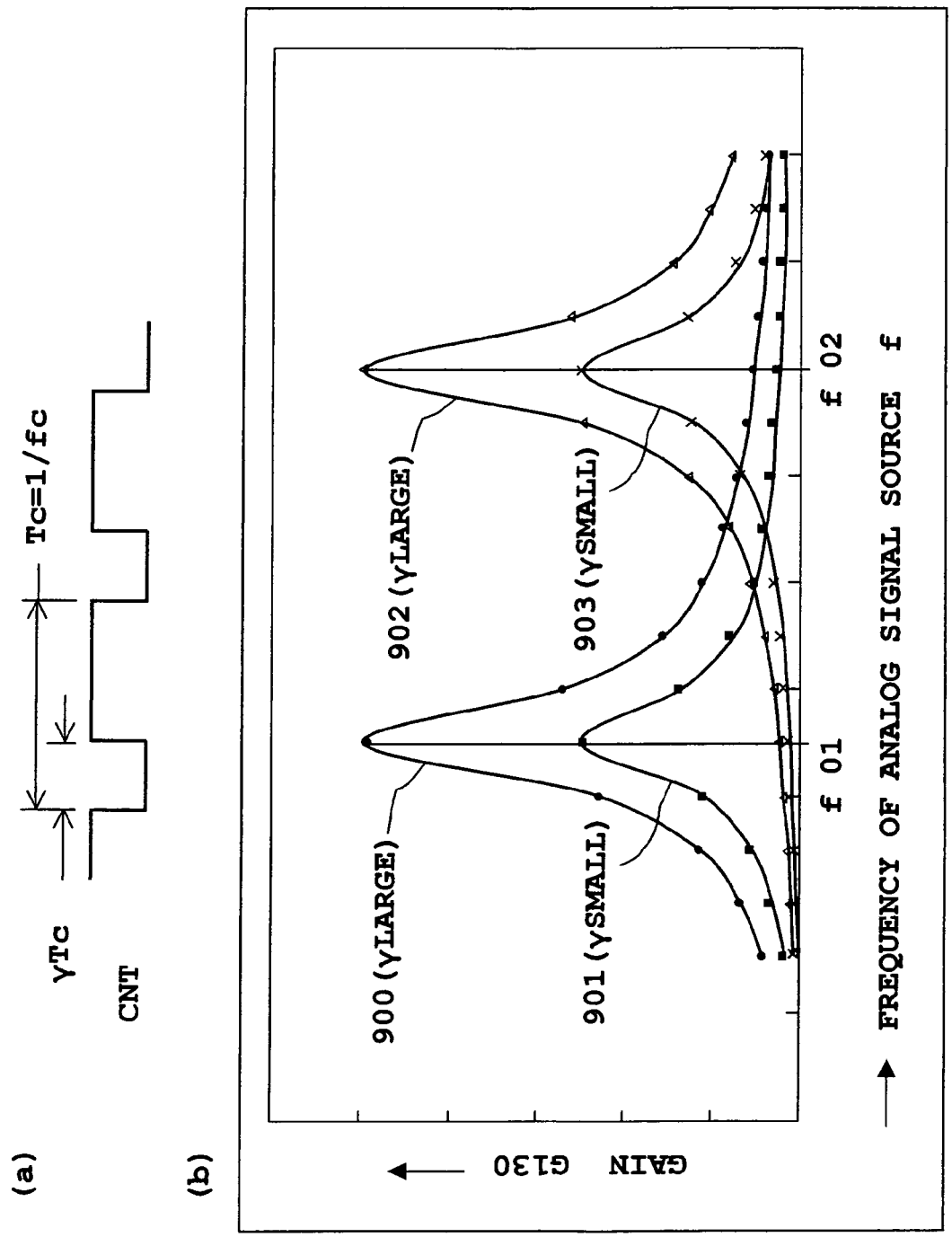
FIGS. 9(a) and (b) are charts each for explaining operations of the analog input signal processing circuit according to the fourth embodiment.

FIGS. 9(a) and (b) are diagrams each for explaining operations of an analog input signal processing circuit according to the fourth embodiment shown in FIG. 7.

FIG. 9(a) represents a waveform of a control signal pulse train CNT. In this waveform, logic levels are changed from "L" to "H" within a pulse period Tc, being an inverse of a pulse frequency fc. A pulse duty γ is defined as a ratio between a period of a logic level being "L" and a period Tc.

FIG. 9(b) represents gain characteristics, being an input/output ratio ΔV2/ΔV1 of the whole of a circuit block 130e. A calculating expression of being factored into a gain G70 of the gain adjustment circuit 70a section and a gain G80 of the switched capacitor filter circuit 80a section is expressed with the following equations.

$$G130 = G70 \times G80 \quad (4)$$

$$G70 = [R77/(R72+R73)] \times \gamma \quad (5)$$

$$G80 = 1/\sqrt{[1+\{(f0^2-f^2)/(fb \times f)\}^2]} \quad (6)$$

$$f0 = \sqrt{[C82 \times C87/(C76 \times C86)]} \times fc/(2\pi) \quad (7)$$

$$fb = 1/(2\pi C76 \times R77) \quad (8)$$

where: R72, R73, R77 are resistance values of the input resistors 72, 73 and the feedback resistor 77; C76, C86 are electrostatic capacities of the integrating capacitors 76, 86; C82, C87 are electrostatic capacities of the charge/discharge capacitors 82, 87; f0 is a center frequency; fb is a band width frequency; and f is a pulsation frequency of the variable analog signal source 100e, 100f.

As is apparent from the calculating expression (7), a center frequency f0 at which gain G80 becomes the maximum is proportional to a pulse frequency fc of a control signal pulse train CNT. Gain characteristics when letting a center frequency f0 f01 or f02 by the change of a pulse frequency fc are indicated by the curves 900 and 901 or curves 902 and 903.

As is apparent from the calculating expression (5), values of respective curves 900 to 903 are increased or decreased in proportion to a pulse duty γ.

Figure 10:
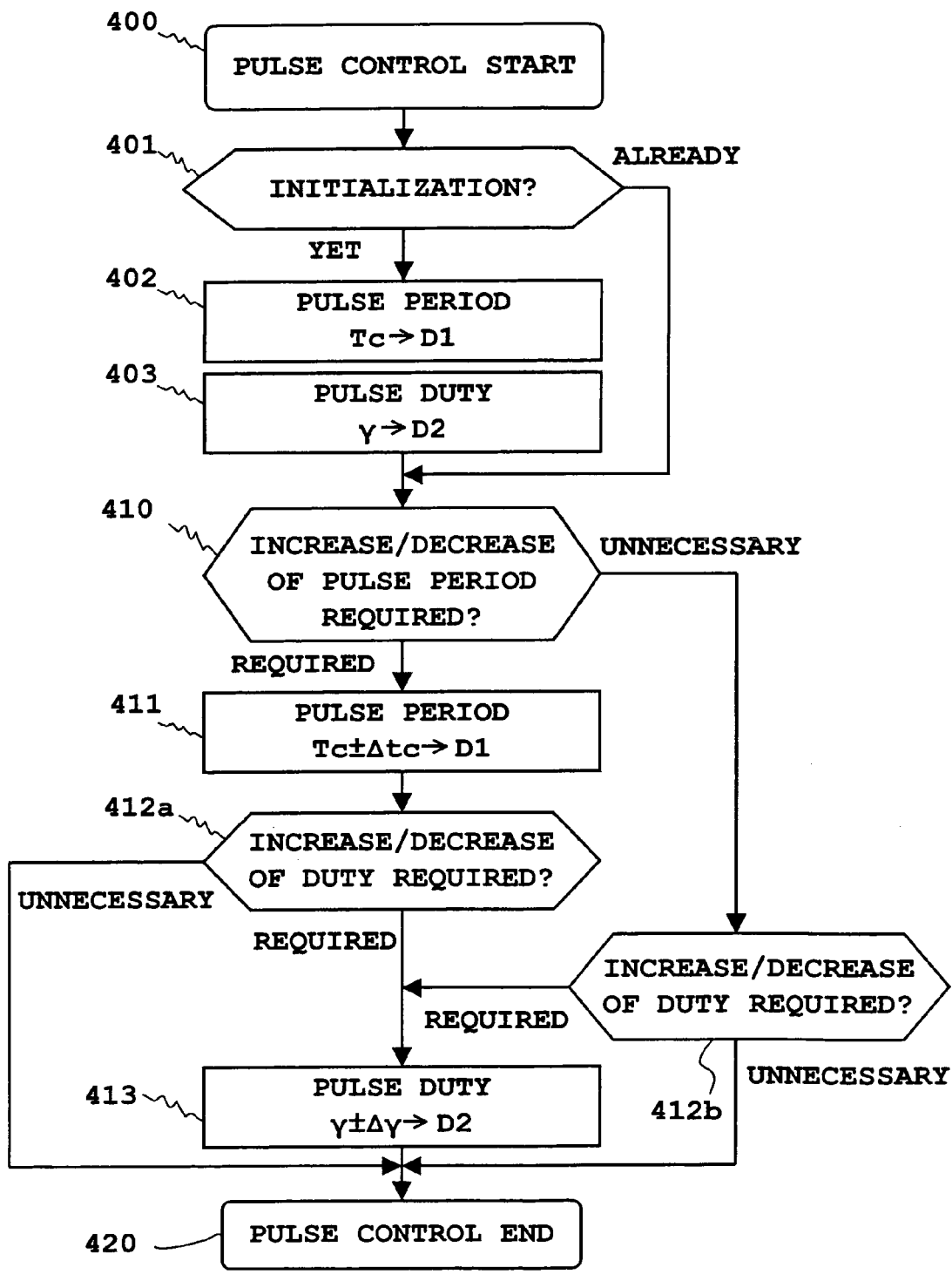
FIG. 10 is a flowchart for explaining operation in the normal routine of the analog input signal processing circuit according to the fourth embodiment.

FIG. 10 is a flowchart for explaining operation in the normal routine of the analog input signal processing circuit according the fourth embodiment shown in FIG. 7.

With reference to FIG. 10, Step 400 is a pulse control start step of the microprocessor 110. This start step 400 is one of the normal control routines under time-sharing processing in the execution process of control programs fit for the use of the microprocessor 110, and is repeatedly activated at intervals of an indefinite time period.

Step 401 is a determination step to be executed subsequently to the start step 400. In this determination step 401, it is determined whether or not initialization with respect to the later-described first and second registers D1 and D2 is to be made depending on whether or not it is the first operation after a power supply has been turned on.

Step 402 is a transfer step to be executed when it is determined in Step 401 that the initialization has not completed yet. In this transfer step 402, an initial value of a pulse period Tc that is stored in the program memory 111 is transferred to the first register D1.

In a transfer step 403 to be executed subsequently to the transfer step 402, an initial value of a pulse duty γ that is stored in the program memory 111 is transferred to the second register D2.

In a determination step 410 to be executed when it is determined in Step 401 that the initialization has been made or subsequently to Step 403, it is determined whether or not the increase or decrease of a pulse period Tc is required in the execution process of control programs not shown.

A compensation transfer step 411 to be executed when it is determined in Step 410 that the increase/decrease of a pulse period Tc is required, is a first setting means for compensating a set value of a pulse period Tc by the algebraic addition of a required increase/decrease value Δtc to a value of a pulse period Ta, which is stored in the first register D1, to restore a resultant value in the first register D1.

In a determination step 412a to be executed subsequently to Step 411 and in a determination step 412b to be executed when it is determined in Step 410 that the increase/decrease of a pulse period Tc is unnecessary, it is determined whether or not the increase/decrease of a pulse duty γ is required in the execution process of control programs not shown.

A compensation transfer step 313 to be executed when it is determined in Step 412a and Step 412b that the increase/decrease of a pulse duty γ is required, is a second setting means for compensating a set value of a pulse duty γ by the algebraic addition of a required increase/decrease value Δγ to a value of a pulse duty γ, which is stored in the second register D2, to restore a resultant value in the second register D2.

Step 420 is an operation end step to proceed when it is determined in Steps 412a and 412b that the increase/decrease of a pulse duty is unnecessary, or subsequently to Step 413. The microprocessor 110 stands by in the operation end step 420, executes the other control programs, and thereafter repeatedly goes to the operation start step 400 again.

Figure 11:
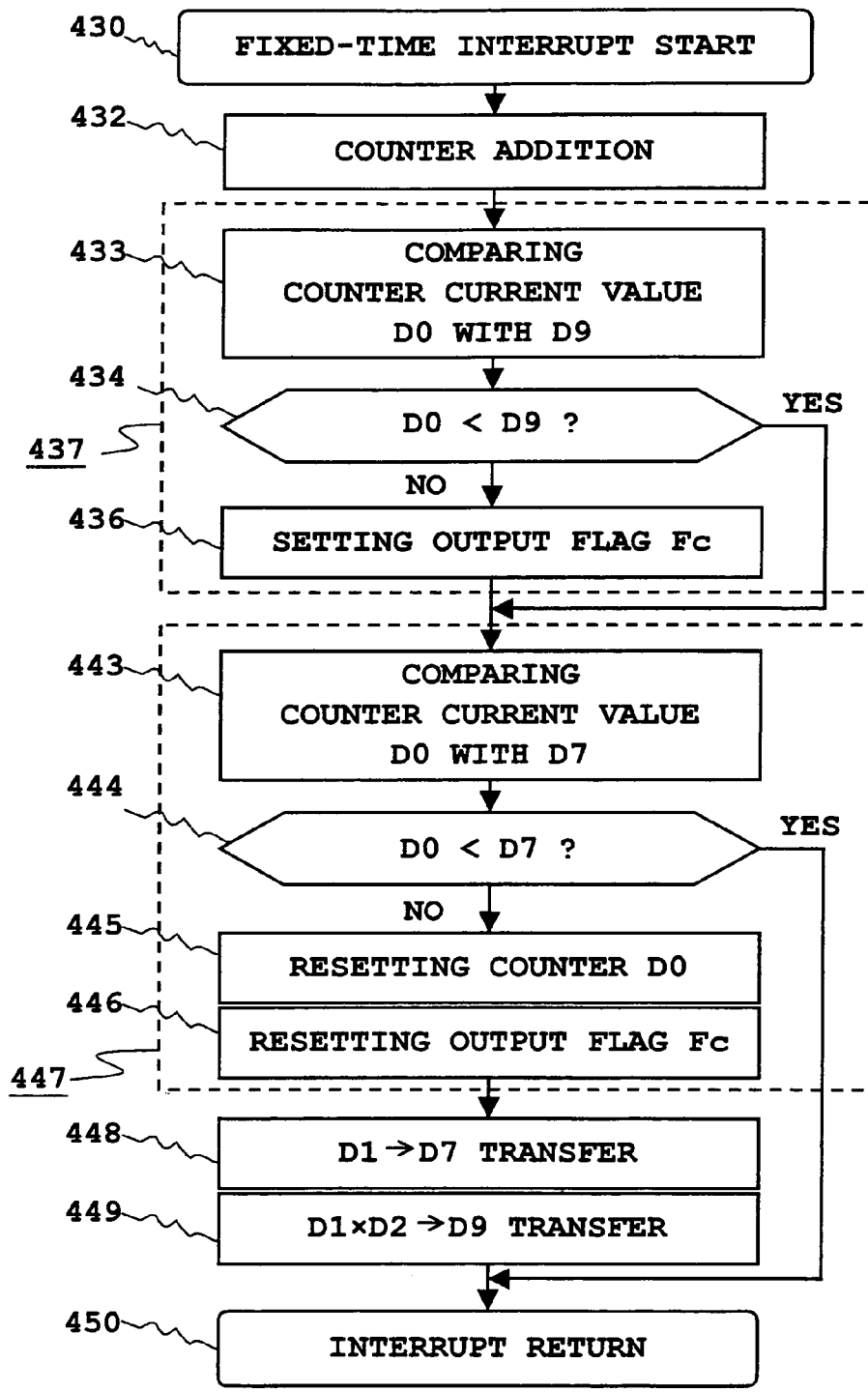
FIG. 11 is a flowchart for explaining operation in the interrupt routine of the analog input signal processing circuit according to the fourth embodiment.

FIG. 11 is a flowchart for explaining operation in the interrupt routine of the analog input signal processing circuit according to the fourth embodiment shown in FIG. 7.

With reference to FIG. 11, Step 430 is an interrupt start step activated at regular intervals with a counting clock signal, not shown, that is obtained by frequency-dividing a clock signal for making the synchronous operation of a microprocessor 110. When this interrupt start step 430 is activated, the microprocessor 110, which has been running the normal control routine, makes an emergency operation save processing, and thereafter discontinues the execution of the normal control routine, proceeding to Step 432.

Step 432 acts as interrupt counting means that causes a current value D0 of a counter, being a memory of a predetermined address in a RAM memory 120, to increase by one count.

A determination step 433 to be executed subsequently to Step 432 is a first comparison means for comparing a current value D0 of a counter with a content of a ninth register D9.

In addition, the ninth register D9 is set in the later-described Step 449. When D9 has not been set at the time of operation start, a content of D9 is 0.

In a determination step 434 to be executed subsequently to Step 433, comparison result in Step 333 is determined. When it is not D0<D9, that is, a current value D0 of a counter is increased to be not less than a content of the ninth register D9, Step 436 is executed.

In Step 436, an output flag Fc, being a memory of a specified address of the RAM memory 120, and a logic level of a control signal pulse train CNT comes to be "H".

Step Block 437 is flag output generation means consisting of Step 433 through Step 436.

Step 443 to be executed when the determination in Step 434 is D0<D9 or subsequently to Step 436 is a second comparison means for comparing a current value D0 of a counter with a content of a seventh register D7.

Moreover, the seventh register D7 is set in the later-described Step 448. When D7 has not been set at the time of operation start, a content of D7 is 0.

In a determination step 444 to be executed subsequently to Step 443, comparison result in Step 443 is determined. When it is not D0<D7, that is, a current value D0 of a counter is increased to be not less than a content of the ninth register D7, Step 445 is executed.

In Step 445, a current value D0 of a counter is reset to be 0; and in the subsequent Step 446, an output flag Fc having been set in Step 436 is reset, and a logic level of a control signal pulse train CNT comes to be "L".

Step block 347 acts as reset means consisting of Step 443 through Step 446.

In Step 448 to be executed subsequently to Step 446, a content of the first register D1 is transferred to the seventh register D7. In the subsequent Step 449, a product value of a content of the first register D1 and content of the second register D2 is transferred to the ninth register D9. Step 449 acts as pulse width operation setting means.

Step 448 and Step 449 are means for freezing so that the change of a pulse period Tc or a pulse duty γ is not accepted during a period of one pulse of control signal pulse being generated.

In an interrupt return step 450 to proceed when the determination of Step 444 is D0<D7, or subsequently to Step 449, operation is returned to a position of the normal control routine having been executed at a time point when Step 430 is activated to restart the execution of the normal control routine.

Furthermore, in this fourth embodiment, pulse width operation setting means 449 is processed in the interrupt control routine, so that batch transfer means 309, 319 as in the foregoing first embodiment shown in FIGS. 3 and 4 are unnecessary. Thus, there is no mixed use of old and new data.

As is understood from the above descriptions, the analog input signal processing circuit 104 according to the fourth embodiment is an analog input signal processing circuit for inputting to a microprocessor 110 a signal related to a signal voltage of a variable analog signal source 100e, 100f; and there are provided in this analog input signal processing circuit at least a switched capacitor filter circuit 80a, a gain adjustment circuit 70a, and a data conversion circuit 50; and a non-volatile program memory 114 that cooperates with the mentioned microprocessor 110 includes a program acting as control pulse train generation means.

The mentioned microprocessor 110 is arranged so as to provide a common control signal pulse train CNT to the mentioned switched capacitor filter circuit 80a and gain adjustment circuit 70a with the mentioned control pulse train generation means.

The mentioned switched capacitor filter circuit 80a is a circuit which includes a switching element 83a·83b, 84a·84b, 88a·88b and 89a·89b of which switching is controlled with a control signal pulse train CNT commanded from the mentioned microprocessor 110, and a charge/discharge capacitor 82, 87; and of which filter characteristics are variable-controlled in response to a pulse frequency of the mentioned control signal pulse train CNT.

The mentioned gain adjustment circuit 70a is a circuit that is commanded from the mentioned microprocessor 110, that makes the switching control of an amplification factor adjustment switching element 75 of which switching is controlled with a control signal pulse train CNT, and that makes the variable control of an amplification factor with respect to an input signal voltage in response to a pulse duty α, β, being ON time period/period or OFF time period/period of a control signal pulse train CNT.

The mentioned data conversion circuit 50 is means that converts a detection current value responsive to a signal voltage of a variable analog signal source 100e, 100f, which is obtained via the mentioned switched capacitor filter circuit 80a and gain adjustment circuit 70a, to a digital logic signal to input it to the mentioned microprocessor 110, and that writes it in a RAM memory 120 acting as a detection data memory via this microprocessor 110.

The mentioned control pulse train generation means is formed of: a first setting means 411 for changing and setting a pulse period Tc; a second setting means 413 for changing and setting a pulse duty; pulse width operation setting means 449 for calculating and setting a product of a pulse period Tc and a pulse duty γ having been changed and set by the first setting means 411 and the second setting means 413; interrupt counting means 432 for counting the number of times of fixed-time interrupts; flag output generation means 437 in which flag is set when a counter current value D0 of this interrupt counting means 432 has reached a set value calculated by the mentioned pulse width operation setting means 449; and reset means 447 for initializing the mentioned counter current value D0 to reset a flag output Fc when a counter current value D0 of the mentioned interrupt counting means 432 has reached a pulse period Tc that is variable-set by the mentioned first setting means 411; and in which a flag output Fc from the mentioned flag output generation means 437 is a control signal pulse train CNT.

As a result, as in the foregoing first embodiment to the third embodiment, it is possible to reduce the number of signals output from the microprocessor; and it is possible to make the mutually independent adjustment of gain and filter characteristics.

Furthermore, it is possible to control with accuracy a pulse period or a pulse width of control signals; and, due to the use of a control signal pulse train of high-speed operation, it is possible to cause a capacitor used in a switched capacitor filter or a gain adjustment circuit to be of small capacity, small size, and low price.

According to this fourth embodiment, in the mentioned control pulse train generation means, the first setting means 411 and the second setting means 413 are processed in the normal control routine acted by no interrupt operation; and interrupt counting means 432, pulse width operation setting means 449, flag output generation means 437, and reset means 447 are processed in the fixed-time interrupt control routine.

As a result, programs necessary to be executed in the fixed-time interrupt control routine are reduced, and an execution time period of the interrupt control program is shortened, thus diminishing the load of a microprocessor 110. Furthermore, it is possible to prevent the occurrence of an inaccurate control signal pulse train CNT resulted from the mixed use of a pulse period based on the pulse period having been changed and set previous time and a pulse period of which setting is newly changed.

According to this fourth embodiment, the mentioned data conversion circuit is an AD converter 50, and a program memory 114 that cooperates with the mentioned microprocessor 110 includes a program acting as data processing means; the mentioned AD converter 50 converts an analog signal voltage, that is obtained via the mentioned switched capacitor filter circuit 80a and gain adjustment circuit 70a, to plural bits of digital data to input it as a digital logic signal with respect to the mentioned microprocessor 110; and the mentioned data processing means transfers and stores a digital output from the mentioned AD converter 50 in a RAM memory 120 as a detection digital voltage, and equivalently changes a comparison reference digital voltage with respect to the mentioned detection digital voltage by changing a pulse duty γ of the mentioned control signal pulse train CNT to change an input/output ratio of a gain adjustment circuit 70a.

As a result, it is characteristic that the microprocessor 110 can calculate a deviation between a digital conversion value having been inputted and a comparison reference digital voltage. Further, even if a comparison reference digital voltage remains to be a comparatively large value, making a larger amplification factor of the gain adjustment circuit 70a corresponds to that an equivalently small comparison reference digital voltage is virtually set. Thus, it is possible to avoid the use in the low power region to improve a digital conversion accuracy of the AD converter 50.

According to this fourth embodiment, the mentioned variable analog signal source 100e, 100f generates a pulsation signal; the mentioned switched capacitor filter circuit 80a forms a band filter circuit in which a center frequency is variable-controlled in response to a pulse frequency of the mentioned control signal pulse train CNT; the mentioned analog input signal processing circuit 104 further comprises a peak hold circuit 90a connected between the mentioned band filter circuit 80a and Ad converter 50 acting as a data conversion circuit; and a program memory 114 that cooperates with the mentioned microprocessor 110 includes a program acting as data fetch signal generation means.

The mentioned peak hold circuit 90a is formed of a maximum value storing capacitor 94 to be charged via a reverse-current blocking diode 92 and a discharge switching element 95 to periodically discharge an electric charge having been charged of this capacitor.

The mentioned data fetch signal generation means is means that, after a predetermined period has passed from which the mentioned discharge switching element 95 is brought in a closed circuit to discharge an electric charge having been charged of the mentioned maximum value storing capacitor 94, and the discharge switching element 95 is brought in an open circuit to charge the mentioned maximum value storing capacitor 94 again, periodically generates a fetch timing signal with which a digital logic signal related to this charging voltage is transferred and stored in the RAM memory 120 via the mentioned AD converter 50 acting as a data conversion circuit and microprocessor 110.

As a result, in the arrangement in which the maximum pulsation voltage at a specified frequency of the variable analog signal sources 100e and 100f is detected, it is possible to make a center frequency of the band filter at a specified frequency of the signal source to detect the maximum pulsation voltage at this specified frequency. Furthermore, it is possible to make an independent adjustment of an amplification factor of the input circuit by controlling a pulse duty γ of a control signal pulse train CNT functioning to adjust filter characteristics.

According to this fourth embodiment, the mentioned variable analog signal source 100e, 100f includes a plurality of variable analog signal sources to be selected and connected to the foremost stage of the mentioned switched capacitor filter circuit 80a and gain adjustment circuit 70a in sequence via a multiplexer 40e; and a program memory 114 that cooperates with the mentioned microprocessor 110 includes a program acting as connection switching signal generation means.

The mentioned connection switching signal generation means is means that sequentially generates a connection switching signal MPX with respect to the mentioned multiplexer 40e, and that separates and writes data to be written in a RAM memory 120 via the mentioned AD converter 50 acting as a data conversion circuit and the mentioned microprocessor 110 with respect to each of a plurality of variable analog signal sources 100e and 100f.

As a result, it is characteristic that even if a number of variable analog signal sources 100e and 100f are connected, the number of the switched capacitor filter circuit 80a, the gain adjustment circuit 70a, or the AD converter 50 acting as a data conversion circuit is not increased, and the number of inputs to the microprocessor 110 may be one. Furthermore, even if the variable analog signal sources 100e and 100f have individually different maximum signal voltage levels, it is possible to make the unified maximum signal voltage level to be inputted to the AD converter acting as a data conversion circuit by adjusting an amplification factor of the gain adjustment circuit 70a.

According to this fourth embodiment, the mentioned variable analog signal source 100e, 100f is a knock sensor for cylinder vibration detection located at a plurality of cylinders of an internal combustion engine, and these plurality of knock sensors are switched and connected in sequence as inputs to the mentioned gain adjustment circuit 70a via a multiplexer 40e; the mentioned switched capacitor filter circuit 80a forms a band filter circuit in which a center frequency is variable-controlled in response to a pulse frequency of the mentioned control signal pulse train CNT;

and a peak hold circuit 90a connected to the fore stage of the mentioned AD converter 50 acting as a data conversion circuit is provided.

The mentioned program memory 114 that cooperates with the mentioned microprocessor includes a program acting as data fetch signal generation means and connection switching signal generation means.

The mentioned peak hold circuit 90a is formed of a maximum value storing capacitor 94 to be charged via a reverse-current blocking diode 92 and a discharge switching element 95 to periodically discharge an electric charge having been charged of this capacitor.

The mentioned data fetch signal generation means is means that, after a predetermined period has passed from which the mentioned discharge switching element 95 is brought in a closed circuit to discharge an electric charge having been charged of the mentioned maximum value storing capacitor 94, and the discharge switching element 95 is brought in an open circuit to charge the mentioned maximum value storing capacitor 94 again, periodically generates a fetch timing signal WIN with which a digital logic signal related to this charging voltage is transferred and stored in the RAM memory 120 via the mentioned AD converter 50 and microprocessor 110.

The mentioned connection switching signal generation means is means for providing a connection switching signal MPX to the mentioned multiplexer 40e so as to select and connect a knock sensor 100e, 100f located at a cylinder just before the explosion stroke in response to a detection angle of a crank angle sensor 132a of the internal combustion engine; and the mentioned data fetch signal generation means determines a fetch timing of data in response to a detection angle of the mentioned crank angle sensor.

As a result, it is characteristic that even if a plurality of knock sensors 100e and 100f are connected, the knock detection may be sequentially done, so that the number of the switched capacitor filter circuit 80a, the gain adjustment circuit 70a, or the data conversion circuit 50 is not increased, and the number of inputs to the microprocessor 110 may be one. Furthermore, it is possible to individually adjust filter characteristics or an amplification factor of the gain adjustment circuit based on an engine speed of load conditions to make the accurate knock determination.

EMBODIMENT 5

Figure 12:
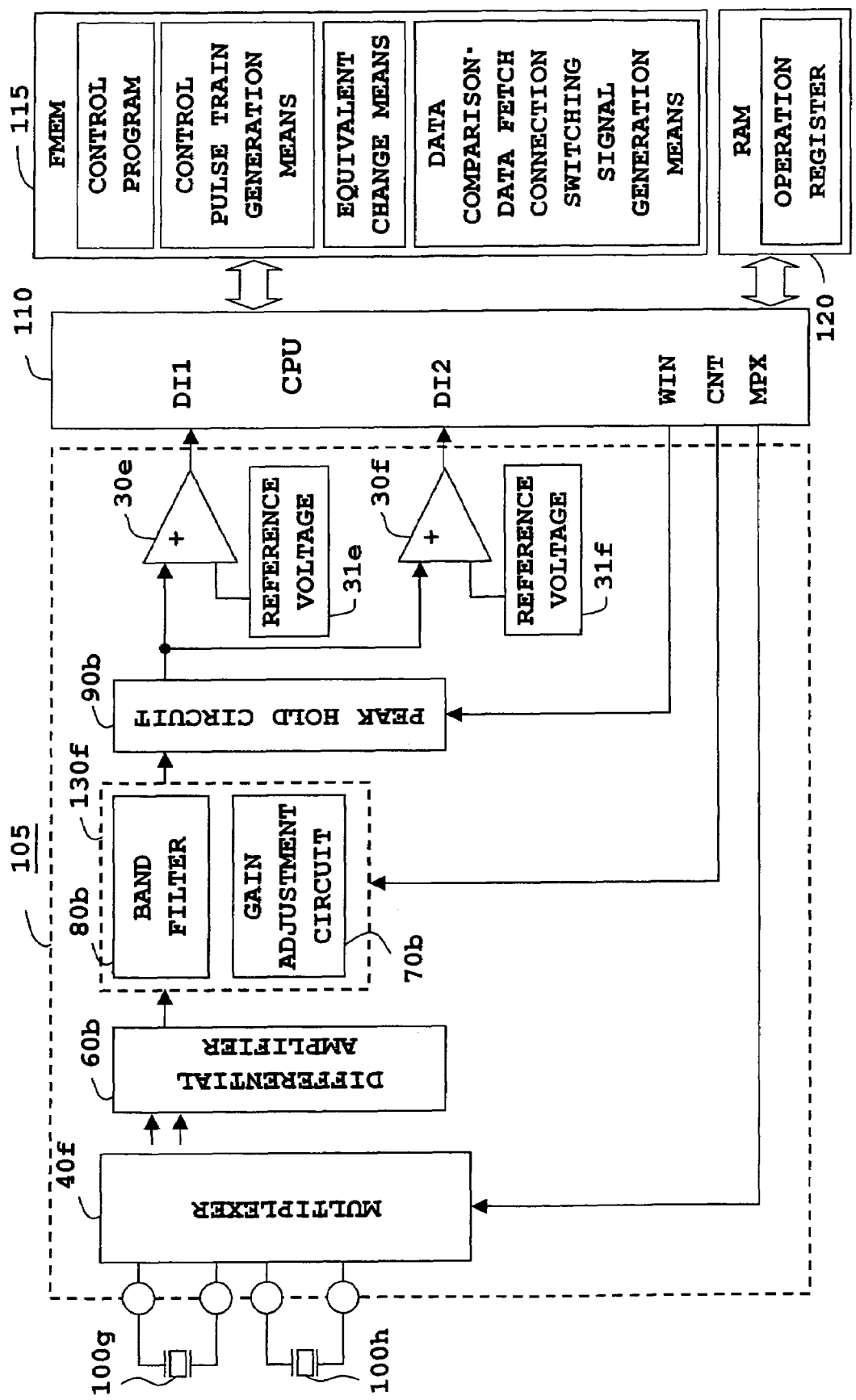
FIG. 12 is a diagram showing the entire circuit arrangement of an analog input signal processing circuit according to a fifth embodiment of the present invention.

FIG. 12 is a diagram showing the entire circuit arrangement of an analog input signal processing circuit according to a fifth embodiment of the invention.

With reference to FIG. 12, an analog input signal processing circuit 105 is provided between variable analog signal sources 100g and 100h and a microprocessor 110.

The analog input signal processing circuit 105 according to this fifth embodiment comprises a multiplexer 40f, a differential amplifier 60b, a circuit block 130f consisting of a gain adjustment circuit 70b and a band filter circuit 80b, and a peak hold circuit 90b as in the detailed description referring g to FIG. 8. However, a data conversion circuit employs first and second analog comparison circuits 30e and 30f instead of an AD converter 50, and first and second comparison reference voltages 31e and 31f are connected to these analog comparison circuits respectively.

The microprocessor 110 provides a fetch timing signal WIN to the peak hold circuit 90b, provides a connection switching signal MPX to the multiplexer 40f, and provides a control signal pulse train CNT to the gain adjustment circuit 70b and the switched capacitor filter 80b acting as a band filter circuit.

Further, comparison determination outputs from the first and second analog comparison circuits 30e and 30f are inputted to the microprocessor 110 as digital logic signals DI1 and DI2.

In a non-volatile program memory 115 such as flash memory bus-connected to the microprocessor 110, stored are programs acting as control pulse train generation means, equivalent change means, data fetch signal generation means, and connection switching signal generation means, and control programs fit for the use of the microprocessor 110.

In a RAM memory 120 for operational processing that is bus-connected to the microprocessor 110, comparison determination result from the first and second analog comparison circuits 30e and 30f, or an operation data provided by control signal pulse train generation means are stored.

Equivalent change means is means for obtaining the analog comparison circuits 30e and 30f with comparison reference voltages that are equivalently changed by changing a pulse duty γ of a control signal pulse train CNT to change an input/output ratio of the gain adjustment circuit 70b.

Data fetch signal generation means is means that, after, a predetermined period has passed from which a discharge switching element of the peak hold circuit 90a is brought in a closed circuit to discharge an electric charge having been charged of the maximum value storing capacitor, and the discharge switching element is brought in an open circuit to charge the maximum value storing capacitor again, periodically generates a fetch timing signal WIN with which a digital logic signal related to this charging voltage is transferred and stored in the RAM memory via the mentioned data conversion circuit and microprocessor.

Connection switching signal generation means is means that sequentially generates connection switching signals MPX with respect to a multiplexer 40f, and that separates and writes data to be written in the RAM memory 120 via the AD converter 50 acting as a data conversion circuit and the microprocessor 110 with respect to each of a plurality of variable analog signal sources.

Figure 13:
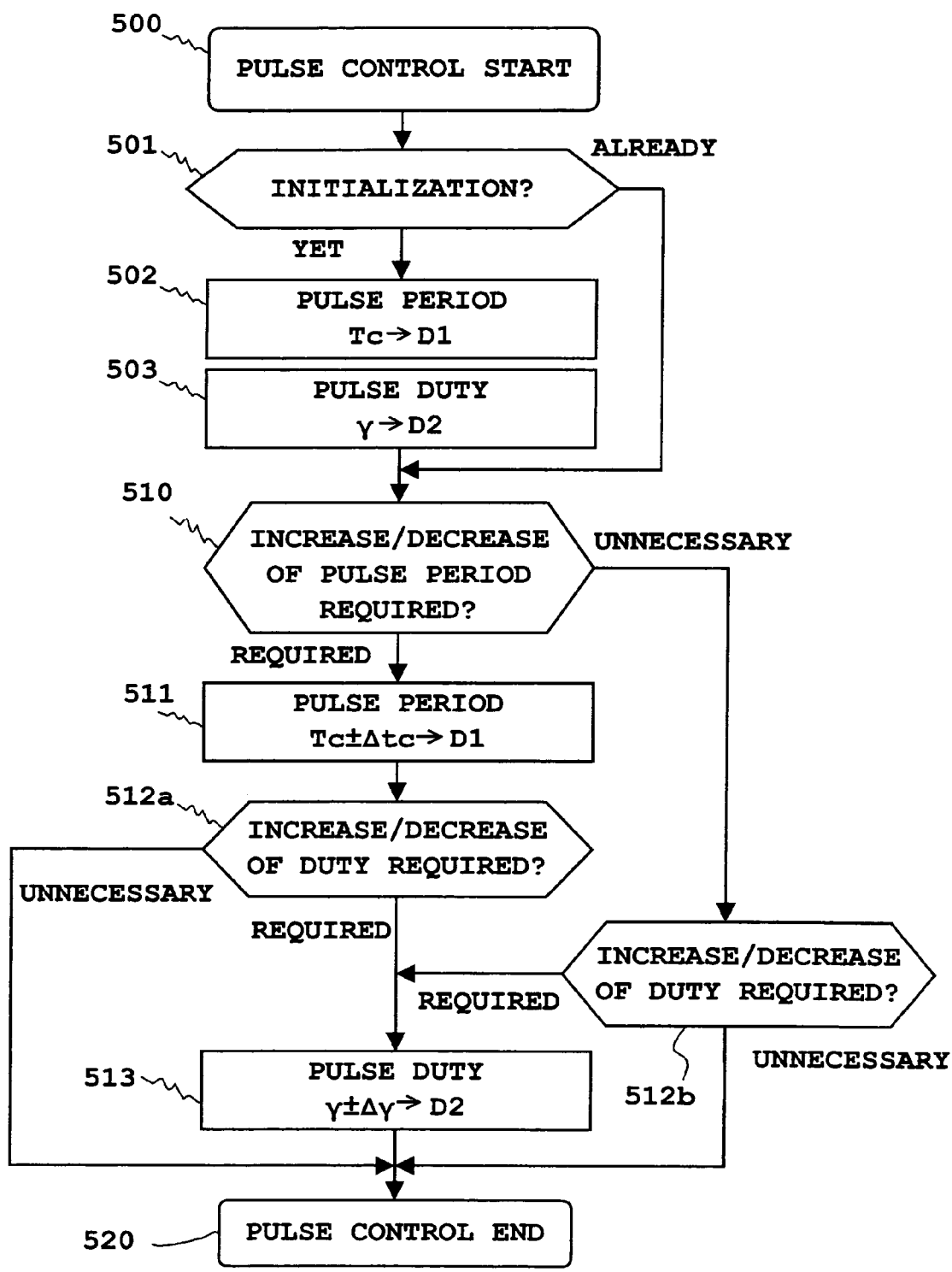
FIG. 13 is a flowchart for explaining operation in the normal routine of the analog input signal processing circuit according to the fifth embodiment.

FIG. 13 is a flowchart for explaining operation in the normal routine of the analog input signal processing circuit according the fifth embodiment shown in FIG. 12.

With reference to FIG. 13, Step 500 is a pulse control start step of the microprocessor 110. This start step 500 is one of the normal control routine under time-sharing processing in the execution process of control programs fit for the use of the microprocessor 110, and is repeatedly activated at intervals of an indefinite time period.

Step 501 is a determination step to be executed subsequently to the start step 500. In this determination step 501, it is determined whether or not initialization with respect to the later-described first and second registers D1 and D2 is made depending on whether or not it is the first operation after a power supply has been turned on.

Step 502 is a transfer step to be executed when it is determined in Step 501 that initialization has not completed yet. In this transfer step 502, an initial value of a pulse period Tc that is stored in the program memory 111 is transferred to the first register D1.

In a transfer step 503 to be executed subsequently to the transfer step 502, an initial value of a pulse duty γ that is stored in the program memory 111 is transferred to the second register D2.

In a determination step 510 to be executed when it is determined in Step 501 that the initialization has been made or subsequently to Step 503, it is determined whether or not the increase or decrease of a pulse period Tc is required in the execution process of control programs not shown.

A compensation transfer step 511 to be executed when it is determined in Step 510 that the increase/decrease of a pulse period Tc is required, is a first setting means for compensating a set value of a pulse period Tc by the algebraic addition of a required increase/decrease value Δtc to a value of a pulse period Tc, which is stored in the first register D1, to restore a resultant value in the first register D1.

In a determination step 512a to be executed subsequently to Step 511 and in a determination step 512b to be executed when it is determined in Step 510 that the increase/decrease of a pulse period Tc is unnecessary, it is determined whether or not the increase/decrease of a pulse duty γ is required in the execution process of control programs not shown.

A compensation transfer step 513 to be executed when it is determined in Step 512a or Step 512b that the increase/decrease of a pulse duty γ is required, is a second setting means for compensating a set value of a pulse duty γ by the algebraic addition of a required increase/decrease value Δγ to a value of a pulse duty γ, which is stored in the second register D2, to restore a resultant value in the second register D2.

Step 520 is an operation end step to proceed when it is determined in Steps 512a and 512b that the increase/decrease of a pulse duty is unnecessary. The microprocessor 110 stands by in the operation end step 520, executes the other control programs, and thereafter repeatedly goes to the operation start step 500 again.

Figure 14:
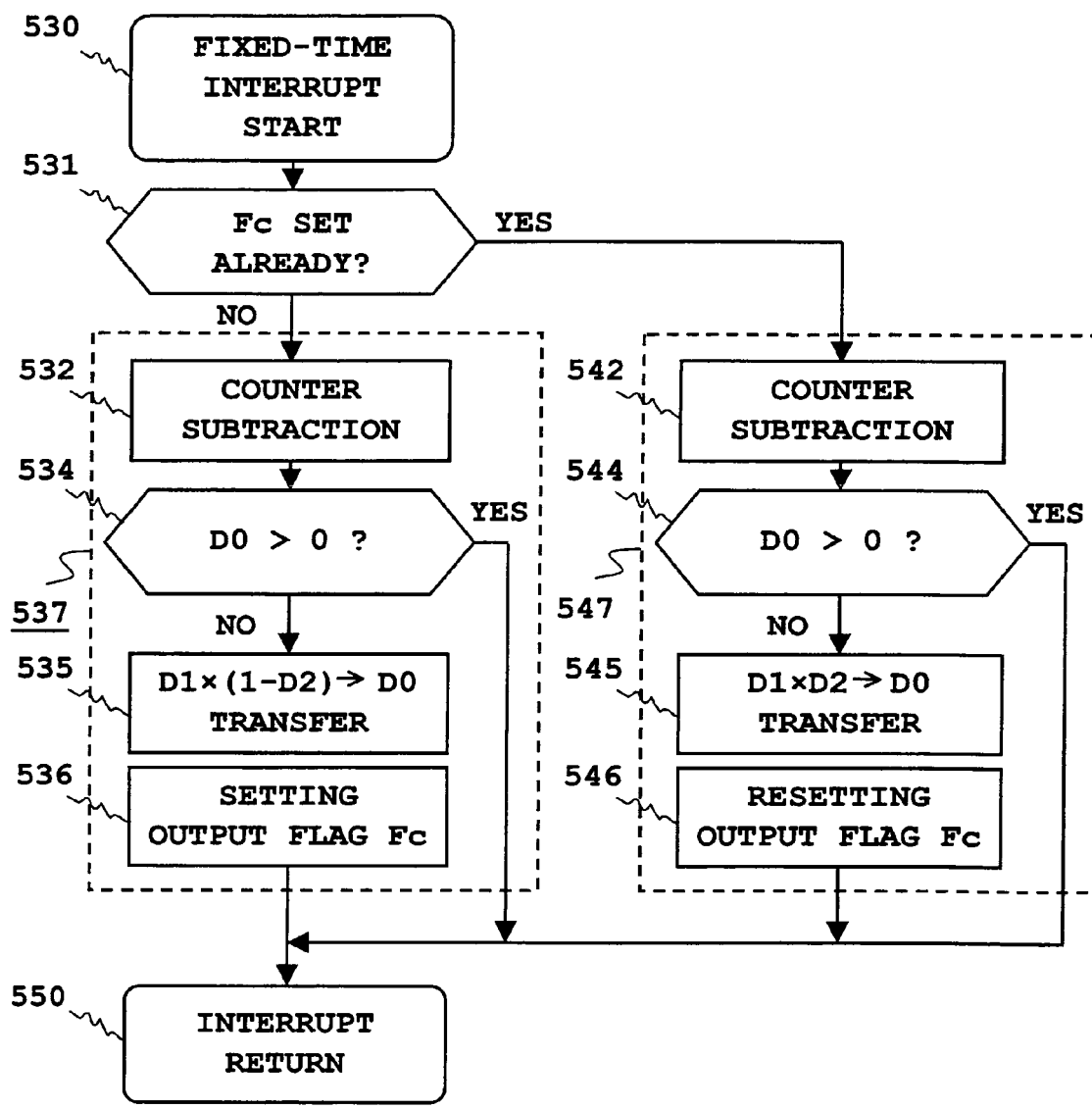
FIG. 14 is a flowchart for explaining operation in the interrupt routine of the analog input signal processing circuit according to the fifth embodiment.

FIG. 14 is a flowchart for explaining operation in the interrupt routine of the analog input signal processing circuit according to the fifth embodiment shown in FIG. 12.

With reference to FIG. 14, Step 530 is an interrupt start step to be activated at regular intervals with a counting clock signal, not shown, that is obtained by frequency-dividing a clock signal for making the synchronous operation of a microprocessor 110. When this interrupt start step 530 is activated, the microprocessor 110, which has been running the normal control routine, makes an emergency operation save processing, and thereafter discontinues the execution of the normal control routine, proceeding to Step 432.

Step 531 is a step in which it is determined whether or not an output flag Fc is set in the later-described Step 536. In case where it is determined in Step 531 that an output flag Fc has not been set, the operation goes to Step 532. In case of having been set already, the operation goes to Step 542.

Step 532 acts as interrupt counting means that causes a current value D0 of a counter, being a memory of a predetermined address in a RAM memory 120, to decrease by one count.

In a determination step 534 to be executed subsequently to Step 532, it is determined whether or not a current value D0 exceeds 0. When D0=0 as a result of the repeated subtraction in Step 532, Step 535 will be executed.

In Step 535, a value of the second half pulse width obtained by subtracting a product of contents of the first register D1 and the second register D2 from a content of the first register D1 is transferred to a current value D0 register of the counter.

In Step 536, an output flag Fc, being a memory of a specified address of the RAM memory 120, is set and a logic level of a control signal pulse train CNT comes to be "H".

Step Block 537 acts as flag output generation means consisting of step 532 through Step 536.

In an interrupt return step 550 to be proceeded when it is determined in Step 534 D0>0 or subsequently to Step 536, the operation returns to a position of the normal control routine having been executed at a time point when Step 530 is activated to restart the execution of the normal control routine.

Step 542 is an interrupt counting means for causing a current value D0 of a counter, being a memory of a predetermined address in the RAM memory 120, to decrease by one count.

In a determination step 544 to be executed subsequently to Step 542, it is determined whether or not a current value D0 exceeds 0. When D0=0 as a result of the repeated subtraction in Step 542, Step 545 will be executed.

In Step 545, a value of the first half pulse width, being a product value of contents of the first register D1 and the second register D2, is transferred to a current value register D0 of the counter.

In Step 546, an output flag Fc having been set in Step 536 is reset, and a logic level of a control signal pulse train CNT comes to be "L".

Step Block 547 acts as reset means consisting of step 542 through Step 546.

In an interrupt return step 550 to be proceed when it is determined in Step 544 that D0>0 or subsequently to Step 546, the operation returns to a position of the normal control routine having been executed at a time point when Step 530 is activated to restart the execution of the normal control routine.

Further, while an initial value of a counter to be subtracted in Step 532 is the first half pulse width having been set in Step 545, an initial value of the counter to be subtracted in Step 542 is the second half pulse width having been set in Step 535. However, a current value of a counter when Step 535 or Step 545 is not executed shortly after operation start, is set to be a predetermined default value.

Furthermore, according to this fifth embodiment, pulse width operation setting means 535 and 545 are processed in the interrupt control routine, so that batch transfer means 309 and 319 as in the foregoing embodiments shown in FIGS. 3 and 4 are unnecessary, resulting in no mixed use of old and new data.

As is understood from the above descriptions, the analog input signal processing circuit 105 according to the fifth embodiment is an analog input signal processing circuit for inputting to a microprocessor 110 a signal related to a signal voltage of a variable analog signal source 100g, 100h, and in which at least a switched capacitor filter circuit 80b, a gain adjustment circuit 70b, and a data conversion circuit 30e, 30f are provided in this analog input signal processing circuit; and a non-volatile program memory 115 that cooperates with the mentioned microprocessor 110 includes a program acting as control pulse train generation means.

The mentioned microprocessor 110 is arranged so as to provide a common control signal pulse train CNT to the mentioned switched capacitor filter circuit 80b and gain adjustment circuit 70b with the mentioned control pulse train generation means.

The mentioned switched capacitor filter circuit 80b is a circuit which includes a switching element of which switching is controlled with a control signal pulse train CNT commanded from the mentioned microprocessor 110, and a charge/discharge capacitor; and of which filter characteristics are variable-controlled in response to a pulse frequency of the mentioned control signal pulse train CNT.

The mentioned gain adjustment circuit 70b is a circuit that is commanded from the mentioned microprocessor 110, that makes the switching control of an amplification factor adjustment switching element of which switching is controlled with a control signal pulse train CNT, and that makes the variable control of an amplification factor with respect to an input signal voltage in response to a pulse duty γ, being ON time period/period or OFF time period/period of a control signal pulse train CNT.

The mentioned data conversion circuit 30e, 30f is means that converts a detection current value responsive to a signal voltage of a variable analog signal source 100g, 100h, which is obtained via the mentioned switched capacitor filter circuit 80b and gain adjustment circuit 70b, to a digital logic signal to input it to the mentioned microprocessor 110, and that writes it in a RAM memory 120 acting as a detection data memory via this microprocessor 110.

The mentioned control pulse train generation means is formed of: a first setting means 511 for changing and setting a pulse period Tc; a second setting means 513 for changing and setting a pulse duty γ; pulse width operation setting means 535, 545 for calculating and setting a product of a pulse period Tc and a pulse duty γ having been changed and set by the first setting means 511 and the second setting means 513; interrupt counting means 532, 542 for counting the number of times of fixed-time interrupts; flag output generation means 437 in which flag is set when a counter value obtained by the subtraction of this interrupt counting means 532 has reached a set value calculated by the mentioned pulse width operation setting means 545; and reset means 547 for initializing the mentioned counter current value D0 to reset a flag output Fc when a counter value obtained by the subtraction of the mentioned interrupt counting means 542 has reached a set value calculated by pulse width operation setting means 535, thereby reaching a pulse period Tc that is variable-set by the mentioned first setting means 511; and in which a flag output Fc from the mentioned flag output generation means 537 is a control signal pulse train CNT.

As a result, as in the foregoing first embodiment to the fourth embodiment, it is possible to reduce the number of signals output from the microprocessor; and it is possible to make the mutually independent adjustment of gain and filter characteristics.

Furthermore, it is possible to control with accuracy a pulse period or a pulse width of control signals; and, due to the use of a control signal pulse train of high-speed operation, it is possible to cause a capacitor used in a switched capacitor filter or a gain adjustment circuit to be of small capacity, small size, and low price.

According to this fifth embodiment, in the mentioned control pulse train generation means, the first setting means 511 and the second setting means 513 are processed in the normal control routine acted by no interrupt operation; and interrupt counting means 532, 542, pulse width operation setting means 535, 545, flag output generation means 537, and reset means 547 are processed in the fixed-time interrupt control routine.

As a result, programs necessary to be executed in the fixed-time interrupt control routine are reduced, and an execution time period of the interrupt control program is shortened, thus diminishing the load of a microprocessor 110. In addition, it is possible to prevent the occurrence of an inaccurate control signal pulse train CNT resulted from the mixed use of a pulse period based on the pulse period having been changed and set previous time and a pulse period of which setting is newly changed.

According to this fifth embodiment, the mentioned data conversion circuit is first and second comparison circuits 30e and 30df, and a program memory 115 that cooperates with the mentioned microprocessor 110 includes a program acting as equivalent change means of a comparison reference voltage.

The mentioned first and second comparison circuits 30e, 30f compare a detection current value of an analog signal voltage that is obtained via the mentioned switched capacitor filter circuit 80b and gain adjustment circuit 70b with a predetermined comparison reference voltage 31e, 31f to input this comparison result to the mentioned microprocessor 110 as a digital logic signal DI1, DI2.

The mentioned equivalent change means is means for obtaining the first and second comparison circuits 30e, 30f with a comparison reference voltage 31e, 31f that is equivalently changed by changing a pulse duty γ of the mentioned control signal pulse train CNT to change an input/output ratio of a gain adjustment circuit 70b.

As a result, even if the first and second comparison reference voltage 31e, 31f is a fixed value, it is possible to change and adjust a virtual comparison reference voltage by adjusting an amplification factor of the gain adjustment circuit 70b.

According to this fifth embodiment, the mentioned analog comparison circuit comprises at least a first and second of plural comparison circuits 30e and 30f; the mentioned first comparison circuit 30e compares a detection current value of an analog signal voltage that is obtained via the mentioned switched capacitor filter circuit 80b and gain adjustment circuit 70b with a first comparison reference voltage 31e to input this comparison result to the mentioned microprocessor 110 as a first comparison result DI1; and the mentioned second comparison circuit 30f compares a detection current value of an analog signal voltage that is obtained via the mentioned switched capacitor filter circuit 80b and gain adjustment circuit 70b with a second comparison reference voltage 31f, being a value larger than the mentioned first comparison reference voltage 31e, to input this comparison result to the mentioned microprocessor 110 as a second comparison result DI2.

As a result, it is possible to speedily determine signal voltages of the variable analog signal sources at multistage levels.

According to this fifth embodiment, the mentioned variable analog signal source 100h generates a pulsation signal; the mentioned switched capacitor filter circuit 80b forms a band filter circuit in which a center frequency is variable-controlled in response to a pulse frequency of the mentioned control signal pulse train CNT; the mentioned analog input signal processing circuit 105 further comprises a peak hold circuit 90b connected between the mentioned band filter circuit 80b and Ad converter 50 acting as a data conversion circuit; and a program memory 115 that cooperates with the mentioned microprocessor 110 includes a program acting as data fetch signal generation means.

The mentioned peak hold circuit 90b is formed of a maximum value storing capacitor to be charged via a reverse-current blocking diode and a discharge switching element to periodically discharge an electric charge having been charged of this capacitor; and the mentioned data fetch signal generation means is means that, after a predetermined period has passed from which the mentioned discharge switching element is brought in a closed circuit to discharge an electric charge having been charged of the mentioned maximum value storing capacitor, and the discharge switching element is brought in an open circuit to charge the mentioned maximum value storing capacitor again, periodically generates a fetch timing signal WIN with which a digital logic signal related to this charging voltage is transferred and stored in the RAM memory 120 via the mentioned analog comparison circuit 30e, 30f acting as a data conversion circuit and microprocessor 110.

As a result, in the arrangement in which the maximum pulsation voltage at a specified frequency of the variable analog signal source is detected, it is possible to make a center frequency of the band filter at a specified frequency of the signal source to detect the maximum pulsation voltage at this specified frequency. In addition, it is possible to make the independent adjustment of an amplification factor of the input circuit by controlling a pulse duty γ of a control signal pulse train CNT functioning to adjust filter characteristics.

According to this fifth embodiment, the mentioned variable analog signal source includes a plurality of variable analog signal sources 100g and 100h to be selected and connected to the foremost stage of the mentioned switched capacitor filter circuit 80b and gain adjustment circuit 70b in sequence via a multiplexer 40c; and a program memory 115 that cooperates with the mentioned microprocessor 110 includes a program acting as connection switching signal generation means.

The mentioned connection switching signal generation means is means that sequentially generates a connection switching signal MPX with respect to the mentioned multiplexer 40f, and that separates and writes data to be written in a RAM memory 120 via the mentioned analog comparison circuit 30e, 30f acting as a data conversion circuit and the mentioned microprocessor 110 with respect to each of a plurality of variable analog signal sources 100g and 100f.

As a result, it is characteristic that even if a number of variable analog signal sources 100g and 100h are connected, the number of the switched capacitor filter circuit 80b, the gain adjustment circuit 70b, or the analog comparison circuit 30e, 30f acting as a data conversion circuit is not increased, and two numbers of inputs to the microprocessor 110 are enough. Furthermore, even if the variable analog signal sources 100g and 100h have individually different maximum signal voltage levels, it is possible to make the unified maximum signal voltage level to be inputted to the first and second comparison circuits 30c and 30d acting as a data conversion circuit by adjusting an amplification factor of the gain adjustment circuit 70b.

OTHER EMBODIMENTS

FIGS. 15(A) to (F) are time charts for explaining operations of analog input signal processing circuits according to the other modifications of the invention.

Figure 15:
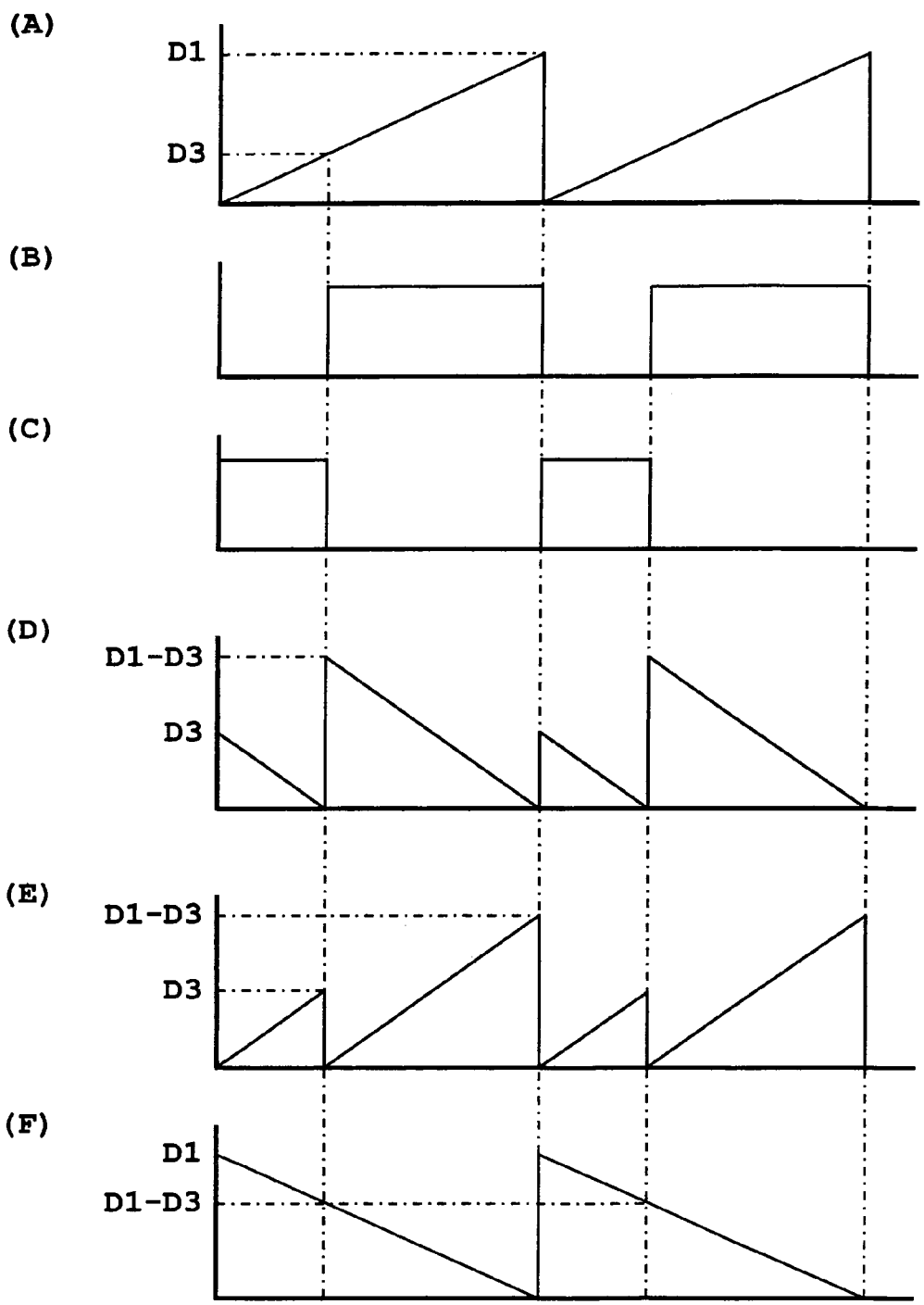
FIGS. 15(A), (B), (C), (D), (E) and (F) are diagrams (time charts) each for explaining operations of analog input signal processing circuits according to the other modifications.

FIG. 15(A) represents the change of a current value D0 of a counter in addition counter system shown in FIGS. 3 and 4 or FIGS. 10 an 11. The axis of abscissas indicates the elapse of time period, and the axis of ordinates indicates a current value D0.

FIG. 15(B) represents a waveform of a control signal pulse train CNT. The first half pulse in this waveform is at a logic level "L", and the second half pulse is at a logic level "H".

A width of the first half pulse is determined with a value of the third register D3, and a width of the entire pulse of the first and second halves is determined with a value of the first register D1.

In addition, a content of the third register D3 is a product value of a content of the first register corresponding to a pulse period Ta and a content of the second register D2 corresponding to a pulse duty γ.

FIG. 15(C) is a waveform obtained by the logic inversion of the waveform of FIG. 15(B) with an inverter.

FIG. 15(D) represents the change of a current value D0 of the counter in subtraction counter system shown in FIGS. 13 and 14.

An initial value of a current value D0 of the counter is a value of the third register D3 at a time point of the start of the first half pulse, and a value obtained by subtracting a content of the third register D3 from a content of the first register D1 at a time point of the start of the second half pulse.

FIG. 15(E) represents the change of a current value D0 of the counter in counting system of being separated into the first and second half pulses in addition counter system.

In this case, a current value D0 of the counter is increased gradually in a region of the first half pulse, and the counter is reset when reaching a value of the third register D3.

A Current value D0 of the counter is increased gradually from 0 again in a region of the second half pulse, and the counter is reset when reaching a value obtained by subtracting a content of the third register D3 from a content of the first register D1.

FIG. 15(F) represents the change of a current value D0 of the counter in the case of counting of not being divided into the first and second half pulses in subtraction count system.

In this case, an initial value of a current value D0 of the counter is determined with a content of the first register D1, an output flag Fc is set when reaching a value obtained by subtracting a content of the third register D3 from a content of the first register D1, and an output flag Fc is reset when a current value D0 becomes 0.

As is understood from the heretofore descriptions, it is preferable that interrupt counting means to be used in this invention is either in addition count system or subtraction count system.

Furthermore, it is possible to make the count with divided into the first half pulse width and the second half pulse width in one period during which logic levels are inverted alternately, or make the count without being divided. In short, being capable of determining an inversion timing of the logic of a control signal pulse train is sufficient.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. An analog input signal processing circuit for inputting to a microprocessor a signal related to a signal voltage of a variable analog signal source:
   the analog input signal processing circuit comprising a switched capacitor filter circuit, a gain adjustment circuit, and a data conversion circuit; and in which a non-volatile program memory that cooperates with said microprocessor includes a program acting as a control pulse train generator;
   wherein said microprocessor is arranged so as to provide a common control signal pulse train to said switched capacitor filter circuit and gain adjustment circuit with said control pulse train generator;
   said switched capacitor filter circuit includes a switching element of which switching is controlled with a control signal pulse train commanded from said microprocessor, and a charge/discharge capacitor; and of which filter characteristics are variably-controlled in response to a pulse frequency of said control signal pulse train;

said gain adjustment circuit, being commanded from said microprocessor, makes the switching control of an amplification factor adjustment switching element of which switching is controlled with said control signal pulse train, and variably controls of an amplification factor with respect to an input signal voltage in response to a pulse duty, defined as an ON time period/period or OFF time period/period of said control signal pulse train;

said data conversion circuit converts a detection current value responsive to a signal voltage of a variable analog signal source, which is obtained via said switched capacitor filter circuit and gain adjustment circuit, to a digital logic signal to input it to said microprocessor, and writes it in a RAM memory acting as a detection data memory via said microprocessor;

said control pulse train generator is formed of: a first setting means for changing and setting a pulse period; a second setting means for changing and setting a pulse duty; pulse width operation setting means for calculating and setting a product of a pulse period and a pulse duty having been changed and set by said first setting means and second setting means; interrupt counting means for counting the number of times of fixed-time interrupts; a flag output generator in which flag is set when a counter current value of said interrupt counting means has reached a set value calculated by said pulse width operation setting means; and reset means for initializing said counter current value to reset a flag output when a counter current value of said interrupt counting means has reached a pulse period that is variably-set by said first setting means; and a flag output from said flag output generator is said control signal pulse train.

2. The analog input signal processing circuit according to claim 1, wherein in said control pulse train generator, said first setting means, second setting means, and pulse width operation setting means are processed in the normal control routine acted by no interrupt operation; and said interrupt counting means, flag output generator, and reset means are processed in the fixed-time interrupt control routine.

3. The analog input signal processing circuit according to claim 2, wherein said control pulse train generator further comprises a pair of operation registers operated so that a set value of a pulse period that is processed by said flag output generator and a set value of a pulse period that is processed by reset means, are the same pulse period.

4. The analog input signal processing circuit according to claim 1, wherein in said control pulse train generator, said first setting means and second setting means are processed in the normal control routine acted by no interrupt operation; and said interrupt counting means, pulse width operation setting means, flag output generator, and reset means are processed in the fixed-time interrupt control routine.

5. The analog input signal processing circuit according to claim 1, wherein said data conversion circuit is an analog comparison circuit, and the program memory that cooperates with said microprocessor includes a program acting as an equivalent change unit of a comparison reference voltage;

said analog comparison circuit compares a detection current value of an analog signal voltage that is obtained via said switched capacitor filter circuit and gain adjustment circuit with a predetermined comparison reference voltage to input said comparison result to said microprocessor as a digital logic signal; and said equivalent change unit obtains an analog comparison circuit with a comparison reference voltage that is equivalently changed by changing a pulse duty of said control signal pulse train to change an input/output ratio of the gain adjustment circuit.

6. The analog input signal processing circuit according to claim 5, wherein said analog comparison circuit comprises at least first and second of plural comparison circuits;

said first comparison circuit compares a detection current value of an analog signal voltage that is obtained via said switched capacitor filter circuit and gain adjustment circuit with a first comparison reference voltage to input said comparison result to said microprocessor as a first comparison result; and said second comparison circuit compares a detection current value of an analog signal voltage that is obtained via said switched capacitor filter circuit and gain adjustment circuit with a second comparison reference voltage, being a value larger than said first comparison reference voltage to input said comparison result to said microprocessor as a second comparison result.

7. The analog input signal processing circuit according to claim 1, wherein said data conversion circuit is an AD converter, and a program memory that cooperates with said microprocessor includes a program acting as a data processor;

said AD converter converts an analog signal voltage that is obtained via said switched capacitor filter circuit and gain adjustment circuit to plural bits of digital data to input it as a digital logic signal with respect to said microprocessor; and said data processor transfers and stores a digital output from said AD converter to and in a RAM memory as a detection digital voltage, and equivalently changes a comparison reference digital voltage with respect to said detection digital voltage by changing a pulse duty of said control signal pulse train to change an input/output ratio of the gain adjustment circuit.

8. The analog input signal processing circuit according to claim 7, wherein said AD converter is a multi-channel AD converter;

said switched capacitor filter circuit, gain adjustment circuit, and control signal pulse train are provided individually with respect to each of a plurality of variable analog signal sources; and said AD converter makes the digital conversion in sequence taking a plurality of analog signal voltages as inputs.

9. The analog input signal processing circuit according to claim 1, wherein said switched capacitor filter circuit forms a low-pass filter circuit for interrupting a high-frequency noise signal; and a smoothing filter circuit of a smaller integration time constant than the minimum integration time constant of the switched capacitor filter is provided in an output stage of said gain adjustment circuit.

10. The analog input signal processing circuit according to claim 9, wherein said variable analog signal source includes a plurality of variable analog signal sources to be selected and connected to the foremost stage of said switched capacitor filter circuit and gain adjustment circuit in sequence via a multiplexer;

said program memory that cooperates with said microprocessor includes a program acting as a connection switching signal generator; and said connection switching signal generator sequentially generates a connection switching signal with respect to said multiplexer, and separates and writes data to be written in a RAM memory via said data conversion circuit and microprocessor with respect to each of a plurality of variable analog signal sources.

11. The analog input signal processing circuit according to claim 1, wherein said variable analog signal source generates a pulsation signal;
said switched capacitor filter circuit forms a band filter circuit in which a center frequency is variably-controlled in response to a pulse frequency of said control signal pulse train;
said analog input signal processing circuit further comprises a peak hold circuit connected between said bandpass filter circuit and data conversion circuit; and
a program memory that cooperates with said microprocessor includes a program acting as a data fetch signal generator;
said peak hold circuit is formed of a maximum value storing capacitor to be charged via a reverse-current blocking diode and a discharge switching element to periodically discharge an electric charge having been stored in said capacitor; and
said data fetch signal generator, after a predetermined period has passed from which said discharge switching element is brought in a closed circuit to discharge an electric charge having been said maximum value storing capacitor, and said discharge switching element is brought in an open circuit to charge said maximum value storing capacitor again, periodically generates a fetch timing signal with which a digital logic signal related to said charging voltage is transferred and stored in the RAM memory via said data conversion circuit and microprocessor.

12. The analog input signal processing circuit according to claim 11, wherein said variable analog signal source includes a plurality of variable analog signal sources to be selected and connected with respect to the foremost stage of said switched capacitor filter circuit and gain adjustment circuit in sequence via a multiplexer;
the program memory that cooperates with said microprocessor includes a program acting as a connection switching signal generator; and
said connection switching signal generator sequentially generates a connection switching signal with respect to said multiplexer, and separates and writes data to be written in a RAM memory via said data conversion circuit and microprocessor with respect to each of a plurality of variable analog signal sources.

13. The analog input signal processing circuit according to claim 1, wherein said variable analog signal source is a knock sensor for cylinder vibration detection located at a plurality of cylinders of an internal combustion engine, and said plurality of knock sensors are switched and connected in sequence as inputs to said gain adjustment circuit via a multiplexer;
said switched capacitor filter circuit forms a bandpass filter circuit in which a center frequency is variably-controlled in response to a pulse frequency of said control signal pulse train, and a peak hold circuit connected to the foremost stage of said AD converter acting as a data conversion circuit is provided;
a program memory that cooperates with said microprocessor includes a program acting as data fetch signal generator and connection switching signal generator;
said peak hold circuit is formed of a maximum value storing capacitor to be charged via a reverse-current blocking diode and a discharge switching element to periodically discharge an electric charge having been stored in said capacitor;
said data fetch signal generator, after a predetermined period has passed from which said discharge switching element is brought in a closed circuit to discharge an electric charge having been stored in said maximum value storing capacitor, and said discharge switching element is brought in an open circuit to charge said maximum value storing capacitor again, periodically generates a fetch timing signal with which a digital logic signal related to said charging voltage is transferred and stored in the RAM memory via said AD converter and microprocessor;
said connection switching signal generator provides a connection switching signal to said multiplexer so as to select and connect the knock sensor that is located at a cylinder just before the explosion stroke in response to a detection angle of a crank angle sensor of the internal combustion engine; and
said data fetch signal generator determines a fetch timing of data in response to a detection angle of said crank angle sensor.

* * * * *